US012278248B2

(12) United States Patent
Son

(10) Patent No.: US 12,278,248 B2
(45) Date of Patent: Apr. 15, 2025

(54) IMAGE SENSOR PACKAGE AND METHOD OF FABRICATING THE SAME

(71) Applicant: Samsung Electronics Co., Ltd., Suwon-si (KR)

(72) Inventor: Bongjin Son, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 535 days.

(21) Appl. No.: 17/240,131

(22) Filed: Apr. 26, 2021

(65) Prior Publication Data

US 2022/0115426 A1 Apr. 14, 2022

(30) Foreign Application Priority Data

Oct. 8, 2020 (KR) ......................... 10-2020-0130444

(51) Int. Cl.
  *H01L 27/146* (2006.01)
  *H01L 23/00* (2006.01)
  *H04N 23/54* (2023.01)

(52) U.S. Cl.
  CPC ...... *H01L 27/14618* (2013.01); *H01L 23/562* (2013.01); *H01L 27/14636* (2013.01); *H01L 27/14683* (2013.01); *H04N 23/54* (2023.01)

(58) Field of Classification Search
  CPC ............ H01L 27/14618; H01L 23/562; H01L 27/14636; H01L 27/14683;
  (Continued)

(56) References Cited

U.S. PATENT DOCUMENTS 8,093,674 B2   1/2012   Tu et al.
8,847,146 B2   9/2014   Tu et al.
(Continued)

FOREIGN PATENT DOCUMENTS

KR   10-2013-0114352 A   10/2013
KR   10-2013-0137993 A   12/2013
(Continued)

OTHER PUBLICATIONS

Extended European Search Report dated Feb. 28, 2022 issued in corresponding European Patent Application No. 21180265.7-1211.

*Primary Examiner* — Meiya Li

(74) *Attorney, Agent, or Firm* — Harness, Dickey & Pierce, P.L.C.

(57) ABSTRACT

Provided are an image sensor package with improved reliability and a method of fabricating the same. The image sensor package includes a package substrate, an image sensor chip mounted on the package substrate, a transparent cover on the image sensor chip, an encapsulant encapsulating the image sensor chip and covering a side surface of the transparent cover, a dam on a surface of the image sensor chip and surrounding a portion of the upper surface of the image sensor, the transparent cover on the dam, a bonding wire connecting a chip pad of the image sensor chip to a substrate pad of the package substrate, the dam covering a first end of the bonding wire connected to the chip pad, and a stress reducing layer covering a second end of the bonding wire connected to the substrate pad, the stress reducing layer including substantially the same material as the dam.

15 Claims, 23 Drawing Sheets

(58) Field of Classification Search
CPC ... H01L 2224/73265; H01L 2224/8592; H01L 2224/92247; H01L 31/02005; H01L 31/0203; H04N 23/54
See application file for complete search history.

(56) References Cited

U.S. PATENT DOCUMENTS

| | | |
|---|---|---|
| 9,263,492 B2 | 2/2016 | Hwang |
| 9,276,023 B2 | 3/2016 | Yamada et al. |
| 9,966,401 B2 | 5/2018 | Jun |
| 10,008,533 B2 | 6/2018 | Jun |
| 10,032,824 B2 | 7/2018 | Deng et al. |
| 2006/0024856 A1* | 2/2006 | Derderian ......... H01L 27/14618 438/57 |
| 2010/0164082 A1* | 7/2010 | Fujisawa ............... H01L 21/568 257/434 |
| 2012/0257075 A1* | 10/2012 | Kamada ............ H01L 27/14618 257/E31.127 |
| 2013/0264703 A1* | 10/2013 | Tae ................... H01L 27/14618 257/737 |
| 2019/0057952 A1* | 2/2019 | Chen ....................... H01L 24/29 |
| 2019/0165019 A1* | 5/2019 | Wang ................ H01L 27/14618 |

FOREIGN PATENT DOCUMENTS

| | | |
|---|---|---|
| KR | 10-2017-0037459 A | 4/2017 |
| KR | 10-2126418 B1 | 6/2020 |
| TW | 200929453 A | 7/2009 |
| WO | WO-2009/001859 A1 | 12/2008 |

\* cited by examiner

IMAGE SENSOR PACKAGE AND METHOD OF FABRICATING THE SAME

CROSS-REFERENCE TO RELATED APPLICATION

This application claims the benefit of Korean Patent Application No. 10-2020-0130444, filed on Oct. 8, 2020, in the Korean Intellectual Property Office, the disclosure of which is incorporated herein in its entirety by reference.

BACKGROUND

Inventive concepts relate to an image sensor, and more particularly, to an image sensor package and/or a method of fabricating the same.

An image sensor package, which is a core component mounted in some devices such as a camera device, has been used in a wide variety of fields, such as portable terminals, such as mobile phones and/or tablets, beyond the scope of typical cameras. The image sensor package may have various package structures, such as a chip-on board (COB) package, a chip-on flexible (COF) printed circuit board (PCB) package, a chip-on glass (COG) package, a wafer-level chip-scale package (WLCSP), an image sensor ball grid array (IBGA) package, and a plastic leadless chip carrier (PLCC) package. Moreover, the fabrication of an IBGA image sensor package, which is widely applied to vehicles such as autonomous vehicles, may include mounting an image sensor on a substrate and adhering a transparent member (or transparent member cover) over the image sensor.

SUMMARY

Inventive concepts provide an image sensor package having improved reliability and/or a method of fabricating the image sensor package.

According to some example embodiments of inventive concepts, there is provided an image sensor package including a package substrate, an image sensor chip mounted on the package substrate, a transparent cover on the image sensor chip, an encapsulant encapsulating the image sensor chip and covering a side surface of the transparent cover, a dam on an upper surface of the image sensor chip and surrounding an outer portion of the upper surface of the image sensor, the transparent cover on the dam, a bonding wire electrically connecting a chip pad of the image sensor chip to a substrate pad of the package substrate, the dam covering a first end of the bonding wire connected to the chip pad, and a stress reducing layer covering a second end of the bonding wire connected to the substrate pad, the stress reducing layer including substantially the same material as the dam.

According to some example embodiments of inventive concepts, there is provided an image sensor package including a package substrate having an upper surface on which a substrate pad is located and having a lower surface on which an external connection terminal is located, an image sensor chip on the package substrate, the image sensor chip comprising a sensor circuitry in an upper central portion of the image sensor chip, a dam on an upper surface of the image sensor chip, the dam surrounding an outer portion of the upper surface of the image sensor chip, the dam covering a chip pad of the image sensor chip, a transparent cover on the dam and apart from the upper surface of the image sensor chip, a bonding wire configured to electrically connect the chip pad to the substrate pad, a stress reducing layer on the package substrate, the stress reducing layer covering the substrate pad, and an encapsulant on the package substrate, the encapsulant encapsulating the image sensor chip and covering a side surface of the transparent cover. A material of the stress reducing layer is substantially the same as a material of the dam, and the dam covers a first end of the bonding wire which is connected to the chip pad, the stress reducing layer covers a second end of the bonding wire which is connected to the substrate pad, and the encapsulant covers a middle portion of the bonding wire between the first end and the second end.

According to some example embodiments of inventive concepts, there is provided a method of fabricating an image sensor package. The method includes preparing a package substrate, mounting an image sensor chip on the package substrate, connecting a chip pad of the image sensor chip to a substrate pad of the package substrate by using a bonding wire, forming a dam on an upper surface of the image sensor chip, the dam surrounding an outer portion of the upper surface of the image sensor chip and covering a first end of the bonding wire connected to the chip pad, forming a stress reducing layer on the package substrate, the stress reducing layer covering a second end of the bonding wire connected to the substrate pad, adhering a transparent cover to the dam to be apart from the upper surface of the image sensor chip, forming an encapsulant on the package substrate, the encapsulant encapsulating the image sensor chip and cover a side surface of the transparent cover, and forming an external connection terminal on a lower surface of the package substrate. A material of the stress reducing layer is substantially the same as a material of the dam.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF SOME EXAMPLE EMBODIMENTS

Figure 1A:
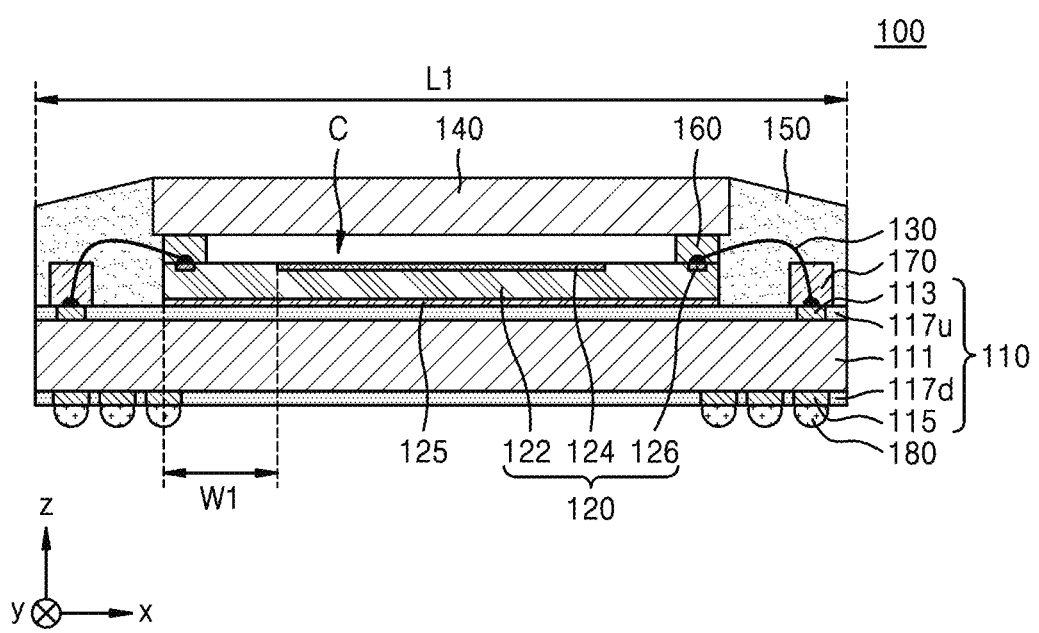
FIGS. 1A and 1B are respectively a cross-sectional view and a plan view of an image sensor package according to some example embodiments.

Hereinafter, some example embodiments will be described in detail with reference to the accompanying drawings. The same reference numerals are used to denote the same elements in the drawings, and repeated descriptions thereof will be omitted.

Figure 1B:
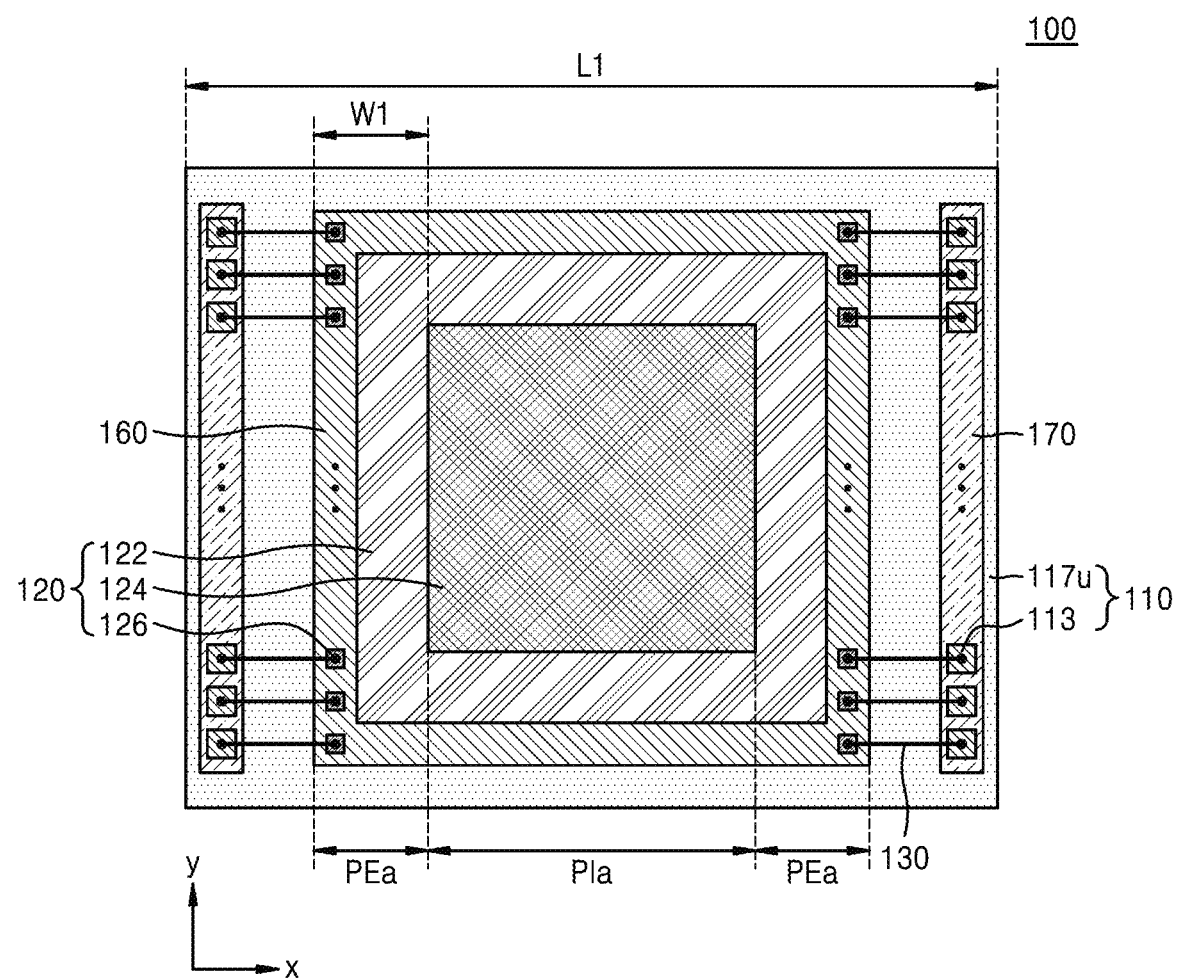

FIGS. 1A and 1B are respectively a cross-sectional view and a plan view of an image sensor package 100 according to some example embodiments.

Referring to FIGS. 1A and 1B, the image sensor package 100 according to some example embodiments may include a package substrate 110, an image sensor chip 120, bonding wires 130, a transparent cover 140, an encapsulant 150, a dam 160, and a stress reducing layer 170.

The package substrate 110 may include a body layer 111, upper substrate pads 113, lower substrate pads 115, and upper and lower protective layers 117u and 117d. The body layer 111 may include various materials. For example, the body layer 111 may include at least one of silicon, ceramic, an organic material, glass, or an epoxy resin according to a kind of the package substrate 110. In the image sensor package 100 of some example embodiments, the package substrate 110 may include a printed circuit board (PCB), which is based on an epoxy resin. Single-layered or multi-layered wirings may be formed in the body layer 111. The upper substrate pads 113 may be electrically connected to the lower substrate pads 115 through the wirings of the body layer 111.

The package substrate 110 may have a long rectangular shape extending in one direction. For example, the package substrate 110 may have a long rectangular shape, e.g. a line shape, in a first direction (x direction), and the upper substrate pads 113 may be arranged on both sides of the package substrate 110 in the first direction (x direction). In some example embodiments, the package substrate 110 may have a square shape; however, a shape of the package substrate 110 is not limited thereto. The package substrate 110 may have a first length L1 in a lengthwise direction, for example, the first direction (x direction). The first length L1 may be, for example, about 8.0 mm or less. However, the first length L1 is not limited to the above-described value. In addition, a side surface of the encapsulant 150 on the package substrate 110 may be limited by a side surface of the package substrate 110. Accordingly, a planar size of the image sensor package 100 may be typically determined by a planar size of the package substrate 110.

The upper substrate pads 113 may be formed on an upper surface of the body layer 111 and may be connected to the wirings of the body layer 111. The upper substrate pads 113 may be arranged along both side surfaces of the image sensor chip 120 mounted on the package substrate 110 and may be electrically connected to the chip pads 126 of the image sensor chip 120 by using a wire bonding process. Specifically, the upper substrate pads 113 are in outer portions of both side surfaces of the package substrate 110 in the first direction (x direction) and arranged in a second direction (y direction). As can be seen from FIG. 1B, the upper substrate pads 113 may be arranged in one column in the second direction (y direction). However, in some example embodiments, the upper substrate pads 113 may be arranged in at least two columns in the second direction (y direction).

The lower substrate pads 115 may be formed on a lower surface of the body layer 111 and may be connected to the wirings of the body layer 111. The lower substrate pads 115 may be arranged in three columns in the second direction (y direction). However, the arrangement of the lower substrate pads 115 is not limited thereto. For example, the lower substrate pads 115 may be arranged in two, three, four, or more columns or arranged in a two-dimensional (2D) array structure over the entire lower surface of the body layer 111.

The upper and lower protective layers 117u and 117d may respectively cover an upper surface and the lower surface of the body layer 111 and may protect the body layer 111. The upper protective layer 117u may be on the upper surface of the body layer 111, and the lower protective layer 117d may be on a lower surface of the body layer 111. The upper and lower protective layers 117u 117d may include the same or different materials, and may include, for example, solder resist (SR). However, a material of the upper and lower protective layers 117u and 117d is not limited to SR. The upper substrate pad 113 and the lower substrate pad 115 may pass through the upper and lower protective layers 117u and 117d corresponding thereto and be exposed at the upper and lower protective layers 117u and 117d, respectively.

An external connection terminal 180 may be on the lower substrate pad 115. The external connection terminal 180 may include, for example, a solder ball. Thus, the image sensor package 100 of some example embodiments may be classified as a ball grid array (BGA) package, and in particular may be classified as an image sensor ball grid array (IBGA) package. The image sensor package 100 of some example embodiments may be mounted on an external substrate (refer to 510 in FIG. 5) of a device such as a camera device, via the external connection terminal 180.

The image sensor chip 120 may be mounted on the package substrate 110. The image sensor chip 120 may be adhered and fixed to an upper surface of the package substrate 110 by an adhesive layer 125. The adhesive layer 125 may not only adhere the image sensor chip 120 to the package substrate 110. For example, alternatively or additionally the adhesive layer may also reduce external impact on the image sensor chip 120.

The image sensor chip 120 may include a chip body 122, a sensor circuitry or sensor unit 124, and chip pads 126. The chip body 122 may include a substrate and a wiring layer of the image sensor chip 120. The substrate may include, for example, a silicon bulk wafer and/or an epitaxial wafer. The epitaxial wafer may include a crystalline material layer (i.e., a heterogeneous or homogeneous epitaxial layer), which is grown on a bulk substrate by using an epitaxial process. However, the substrate is not limited to a bulk wafer or an epitaxial wafer and may include various wafers, such as a polished wafer, an annealed wafer, and a silicon on insulator (SOI) wafer. The wiring layer may be formed on any surface of the substrate. For example, the wiring layer may be under the sensor unit 124.

The sensor unit 124 may include a pixel area PIa including a plurality of pixels, and/or an active pixel sensor (APS) area. In the pixel area PIa, the pixels may be arranged in a 2D array structure. Also, each of the pixels of the pixel area PIa may include a photodiode formed in the substrate. The photodiode may be formed by doping, e.g. implanting impurity ions into the pixel area PIa using an ion implantation process such as a beamline ion implantation process and/or a plasma assisted doping (PLAD) process. Each of the pixels of the pixel area PIa may absorb incident light, may generate and accumulate charges corresponding to the amount of incident light, and may transmit the accumulated charges to the outside through a pixel transistor. The pixel transistors may include, for example, a transfer transistor, a source-follower transistor, a reset transistor, and a selection transistor. Moreover, the sensor unit 124 may include a color filter and a microlens, which are over the pixel area PIa. As can be seen from FIG. 1B, the sensor unit 124 may be in a central portion of the image sensor chip 120.

The chip pads 126 may be in a peripheral area PEa of the image sensor chip 120. The peripheral area PEa may refer to an outer portion of the image sensor chip 120, which surrounds the sensor unit 124. As shown in FIG. 1B, the chip pads 126 may be arranged in the second direction (y direction) in outer portions of both peripheral areas PEa of the image sensor chip 120 in the first direction (x direction). The chip pads 126 may be electrically connected to the wiring layer of the image sensor chip 120.

The chip pads 126 may be electrically connected to the upper substrate pads 113 of the package substrate 110 by using a wire bonding process. For example, in the wire bonding process, first ends (e.g. 130t1 in FIG. 2A) of the bonding wires 130 may be connected to the chip pads 126, and second ends (e.g. 130t2 in FIG. 2A) of the bonding wires 130 may be connected to the upper substrate pads 113. The bonding wires 130 may include, for example, at least one of gold (Au), copper (Cu), silver (Ag), and aluminum (Al). In the image sensor package 100 of some example embodiments, the bonding wires 130 may include, for example, gold.

The transparent cover 140 may be over the image sensor chip 120. The transparent cover 140 may be on the dam 160 formed on an upper surface of the image sensor chip 120. Thus, the transparent cover 140 may be apart from the image sensor chip 120 by a height of the dam 160, and a cavity C may be formed between the transparent cover 140 and the image sensor chip 120. The cavity C may include air, such as clean, dry air; however, example embodiments are not limited thereto. The transparent cover 140 may include, for example, at least one of transparent glass, a transparent resin, or transmissive ceramic.

The dam 160 may support the transparent cover 140. Also, the dam 160 may encapsulate the cavity C and prevent or reduce the likelihood of contamination of the image sensor chip 120 (e.g., the sensor unit 124) by inhibiting external moisture and/or foreign materials from penetrating into the cavity C. As shown in FIG. 1B, the dam 160 may have a rectangular ring/rectangular annulus shape surrounding an outer portion of the upper surface of the image sensor chip 120. Furthermore, in the image sensor package 100 of some example embodiments, the dam 160 may cover the chip pads 126 of the image sensor chip 120 and also, cover first ends 130t1 of the bonding wires 130.

As described above, the dam 160 may support the transparent cover 140 and may prevent or reduce the likelihood of contamination of the sensor unit 124. The dam 160 may surround the sensor unit 124 and be formed on the upper surface of the image sensor chip 120. A first width W1, which is a distance between an edge of the sensor unit 124 and an edge of the image sensor chip 120, is being reduced due to the shrinking/miniaturization of the image sensor chip 120. For example, the first width W1 may be about 520 μm or less. As the first width W1 is reduced, as shown in FIG. 1B, the dam 160 may have a rectangular ring shape/annular shape surrounding an outermost portion of the image sensor chip 120 and covering the chip pad 126 arranged in the outermost portion of the image sensor chip 120 and the first end 130t1 of the bonding wire 130, which is connected to the chip pad 126.

Moreover, because the dam 160 is in the outermost portion of the image sensor chip 120, as shown in FIG. 1A, an outer side surface of the dam 160 may be substantially adjacent to or the same as the side surface of the image sensor chip 120 in the first direction (x direction). In general, a size of the transparent cover 140 may be greater than a size of the image sensor chip 120. For example, a length of the transparent cover 140 may be greater than a length of the image sensor chip 120 in the first direction (x direction). Thus, the outer side surface of the dam 160 may be on an inner side of a side surface of the transparent cover 140.

The dam 160 may include an appropriate material considering or based on the stress of the bonding wires 130 and physical properties of the encapsulant 150. For example, the dam 160 may include a glue adhesive. However, a material of the dam 160 is not limited to a glue adhesive. The material of the dam 160 will be described in further detail with reference to FIGS. 2A and 2B.

The encapsulant 150 may be on the package substrate 110 and may encapsulate the image sensor chip 120, the bonding wires 130, and the transparent cover 140. For example, the encapsulant 150 may be formed on an upper surface of the package substrate 110 to cover side surfaces of the image sensor chip 120 and the transparent cover 140. Also, the encapsulant 150 may cover the outer side surface of the dam 160 while covering the bonding wires 130. The encapsulant 150, along with the dam 160, may prevent or reduce the likelihood of the sensor unit 124 of the image sensor chip 120 being contaminated with foreign materials. Alternatively or additionally, the encapsulant 150 may protect the image sensor package 100 from external impact.

The encapsulant 150 may surround the entire side surface of the transparent cover 140, and an upper surface of the encapsulant 150 may be inclined at a slight angle with respect to an upper surface of the transparent cover 140. However, in some example embodiments, the upper surface of the encapsulant 150 may be substantially coplanar with the upper surface of the transparent cover 140. The encapsulant 150 may include, for example, an epoxy molding compound (EMC). However, a material of the encapsulant 150 is not limited to an EMC. A material of the encapsulant 150 will be described in further detail with reference to FIGS. 2A and 2B along with the material of the dam 160.

The stress reducing layers 170 may be formed in both outer portions of the package substrate 110 in the first direction (x direction) and extend in the second direction (y direction). Alternatively or additionally, the stress reducing layers 170 may cover the upper substrate pads 113 and the second ends 130t2 of the bonding wires 130, which are connected to the upper substrate pads 113. The stress reducing layer 170 may include substantially the same material as the dam 160. For example, the stress reducing layer 170 may include a glue adhesive. However, a material of the stress reducing layer 170 is not limited to a glue adhesive. The material of the stress reducing layer 170 will be described in further detail with reference to FIGS. 2A and 2B along with the material of the dam 160.

Moreover, the more the stress reducing layer 170 covers the bonding wires 130, the more that stress applied to the bonding wires 130 may be reduced. Thus, as shown in FIG. 1A, the stress reducing layer 170 may be formed to have a greater thickness than the dam 160. In some example embodiments, a width of the stress reducing layer 170 may be greater than a width of the dam 160 in the first direction (x direction). However, in some example embodiments, at least one of the thickness and the width of the stress reducing layer 170 may be less than the thickness and/or the width of the dam 160 due to process restrictions.

In the image sensor package 100 of some example embodiments, the image sensor chip 120 may be mounted on the package substrate 110 by using a wire bonding technique. End portions of the bonding wires 130 for the wire bonding process may be covered by the dam 160 and the stress reducing layer 170. For example, the first ends 130t1 of the bonding wires 130, which are connected to the chip pads 126, may be covered by the dam 160, and the second ends 130t2 of the bonding wires 130, which are connected to the upper substrate pads 113, may be covered by the stress reducing layer 170. Alternatively or additionally, the stress reducing layer 170 may include substantially the same material as the dam 160. Accordingly, in the image sensor package 100 of some example embodiments, defects (e.g., cracks) may be greatly reduced in the bonding wires 130 by reducing stress applied to the bonding wires 130. As a result, an image sensor package having improved reliability may be implemented.

Figure 2A:
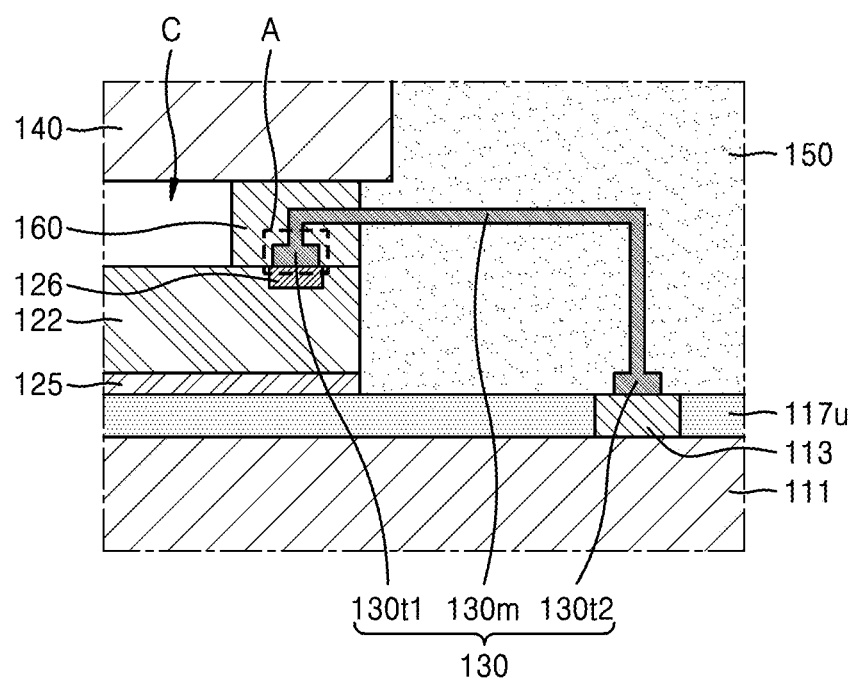
FIGS. 2A and 2B are enlarged views for explaining the cause of cracks in bonding wires in a wire bonding structure of an image sensor package.
Figure 2B:
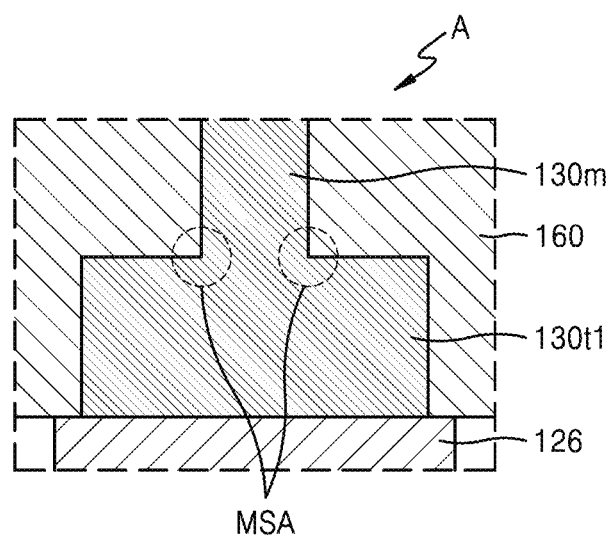

FIGS. 2A and 2B are enlarged views for explaining a cause of cracks in bonding wires in a wire bonding structure of an image sensor package. FIG. 2A is an enlarged view of a wire bonding portion, and FIG. 2B is an enlarged view of region A of FIG. 2A. In FIGS. 2A and 2B, a bonding wire 130 is illustrated in a right-angled form for brevity. The description of components of some example embodiments that are the same as those described with reference to FIGS. 1A and 1B will be omitted or briefly presented.

Referring to FIGS. 2A and 2B, in a wire bonding structure of an image sensor package 100 of some example embodiments, a portion of the bonding wire 130 on which stress is concentrated may be a portion of the bonding wire 130, which is connected to a chip pad 126. For example, when the bonding wire 130 is divided into a first end 130t1 connected to the chip pad 126, a second end 130t2 connected to the upper substrate pad 113, and a middle line 130m between the first end 130t1 and the second end 130t2, as indicated by dashed circles in FIG. 2B, both side surfaces of a connection portion between the first end 130t1 and the middle line 130m may be detected as or correspond to large, e.g. maximum stress areas MSA in which the most stress occurs. The reason that the most stress occurs in the maximum stress area MSA may be as follows. Portions of the first end 130t1 and the middle line 130m may be covered by a dam 160, and a large portion of the middle line 130m and the second end 130t2 may be covered by the encapsulant 150. In general, a glass temperature, e.g. a glass transition temperature, Tg of the encapsulant 150 may be low, and/or a coefficient of thermal expansion (CTE) of the encapsulant 150 may be high at the glass temperature Tg or higher. Accordingly, at high temperatures greater than the glass temperature Tg, although the dam 160 fixes and holds the bonding wires 130, the encapsulant 150 may expand and pull the bonding wires 130—to thermal expansion, and thus, stress may be applied to the bonding wires 130. For example, stress may be concentrated on the connection portion between the first end 130t1 and the middle line 130m, which is covered by the dam 160.

In the image sensor package 100 of some example embodiments, the stress reducing layer 170 configured to cover the second end 130t2 of the bonding wire 130 may be formed to reduce stress applied to the connection portion between the first end 130t1 of the bonding wire 130 and the middle line 130m. The stress reducing layer 170 may include substantially the same material as the dam 160. Also, the stress reducing layer 170 may include a material having appropriate physical properties considering stress of the bonding wires 130 and physical properties of the encapsulant 150.

As a non-limiting example, a thermal shock experiment may be conducted under a first thermal cycle (TC) condition of about −65° C. to about 150° C. or a second TC condition of about −55° C. to about 125° C. To prevent or reduce the likelihood of cracks from in the bonding wires 130, the dam 160 and the encapsulant 150 may have the following physical properties in the image sensor package 100 of some example embodiments. For example, each of the dam 160 and the encapsulant 150 may have a viscosity of about 40,000 centipoise (cps) to about 80,000 (cps) (@ 25° C.).

Each of the dam 160 and the encapsulant 150 may have a glass temperature of about 125° C. to about 160° C. Also, each of the dam 160 and the encapsulant 150 may have a CTE of about 18 ppm or less below the glass temperature and have a CTE of about 70 ppm or less at the glass temperature or higher. Moreover, as described above, the stress reducing layer 170 may include, e.g. may consist of or consist essentially of, substantially the same material as the dam 160.

For reference, in an image sensor package of the related art, a glue adhesive may be mainly used for a dam. The glue adhesive may have a viscosity of about 90000 cps (@25° C.) and a glass temperature of about 115° C. The glue adhesive may have a CTE of about 53 ppm below the glass temperature and a CTE of about 163 ppm at the glass temperature or higher. A first material used for the encapsulant 150 may have a viscosity of about 80,000 cps (@25° C.) and a glass temperature of about 50° C. The first material may have a CTE of about 20 ppm below the glass temperature and a CTE of about 100 ppm at the glass temperature or higher. Also, a second material used for the encapsulant 150 may have a viscosity of about 42000 cps (@25° C.) and a glass temperature of about 148° C. The second material may have a CTE of about 18 ppm below the glass temperature and a CTE of about 65 ppm at the glass temperature or higher.

Moreover, in some example embodiments, in the image sensor package 100 of some example embodiments, the glue adhesive may be used as the dam 160 and the stress reducing layer 170 and meet or approximately be in the ranges of physical properties described above by adjusting components or a content ratio of a filler. Additionally or alternatively, the second material described above may be used as the encapsulant 150 and may also meet or approximately be in the ranges of physical properties described above by adjusting components or a content ratio of a filler.

Table 1 shows the results of a comparison of stress applied to the bonding wire 130 between a first package structure without the stress reducing layer 170 and a second package structure including the stress reducing layer 170.

TABLE 1

| | Use or disuse of stress reducing layer | Stress@125° C. |
|---|---|---|
| First package structure | x | 137.29 |
| Second package structure | o | 134.49 |

Here, both the first package structure and the second package structure may include the dam 160, and stress may be expressed in units of mega Pascal (MPa). As can be seen from Table 1, when the stress reducing layer 170 is used, stress applied to the bonding wire 130 is low. Alternatively or additionally, as described above, the stress applied to the bonding wire 130 may be further reduced by increasing a thickness or a width of the stress reducing layer 170.

Alternatively or additionally, the image sensor package 100 of some example embodiments may reduce the stress applied to the bonding wire 130 by using the following methods. For example, stress applied to the bonding wire 130 may be reduced by using a method of reducing a length of the bonding wire 130, a method of adjusting physical properties of the encapsulant 150, and/or a method of increasing a package size. For reference, when the length of the bonding wire 130 is increased, moment such as bending moment may increase at a bonding portion of the chip pad 126, which may lead to an increase in the stress applied to the bonding wire 130. Alternatively or additionally, when a total package size is reduced, the length of the bonding wire 130 may be relatively increased, and moment such as bending moment may also increase, thereby increasing stress applied to the bonding wire 130.

Table 2 shows examples of stress applied to a bonding wire with respect to a package size (or PKG Size), a material of an encapsulant (or Encap.), and a length of the bonding wire (or Wire Length).

TABLE 2

|  | PKG Size | Encap. | Wire Length | Stress@125° C. |
|---|---|---|---|---|
| Ref. | 8.0 mm | First | 0.4 mm | 137.29 |
| Case 1 | 8.0 mm | First | 0.3 mm | 114.79 |
| Case 2 | 8.0 mm | First | 0.5 mm | 156.82 |
| Case 3 | 7.3 mm | First | 0.4 mm | 134.44 |
| Case 4 | 8.7 mm | First | 0.4 mm | 133.06 |
| Case 5 | 8.0 mm | Second | 0.4 mm | 54.34 |

In Table 2, Ref. may refer to a reference case, PKG size may refer to a first length L1, First may refer to the first material, and Second may refer to the second material. Also, the length of the bonding wire may be defined as a distance between the chip pad 126 and the upper substrate pad 113 in a first direction (x direction), and stress may be expressed in units of MPa.

In Table 2, in a first case (case 1) in which the bonding wire has a relatively small length and a fifth case (case 5) in which the second material is used as the encapsulant, stress applied to the bonding wire is relatively small as compared to the reference case. Also, the adjustment of physical properties of the encapsulant greatly affects a change in stress applied to the bonding wire, as compared to the adjustment of the package size or the adjustment of the wire length.

Referring to Table 2, in the image sensor package 100 of some example embodiments, the package size may be adjusted to about 8.0 mm or more, and the length of the bonding wire 130 may be adjusted to about 0.7 mm or less. In some example embodiments, in the image sensor package 100 of some example embodiments, the length of the bonding wire 130 may be adjusted to about 0.5 mm or less. For reference, in an image sensor package of the related art, the bonding wire 130 may have a length of about 1.2 mm and is currently being reduced to about 0.8 mm or about 0.9 mm. In Table 2, a wire length of about 0.3 mm or about 0.4 mm may correspond to a length of a test level that is not yet put to practical use.

Figure 3A:
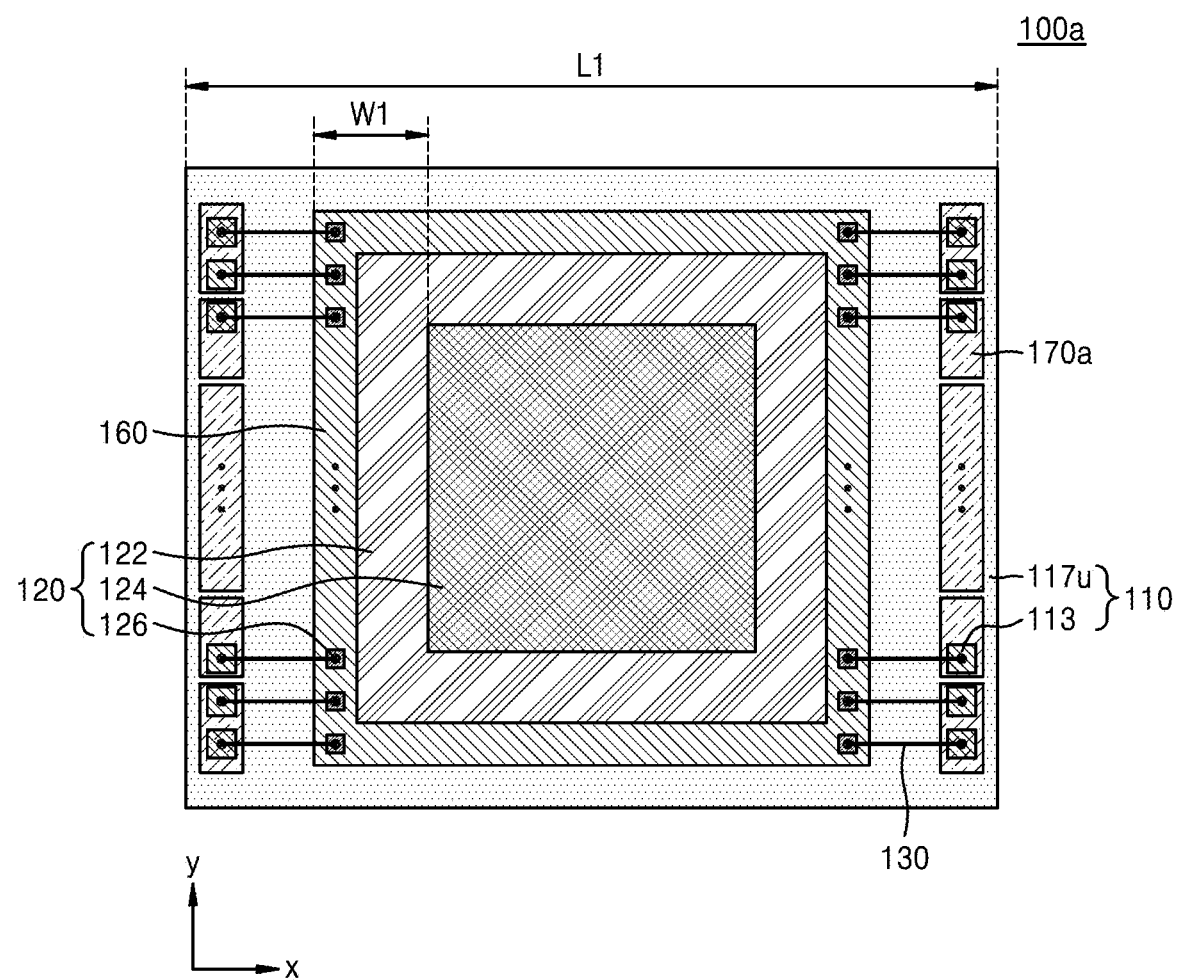
FIGS. 3A to 3C are plan views of image sensor packages according to embodiments.
Figure 3B:
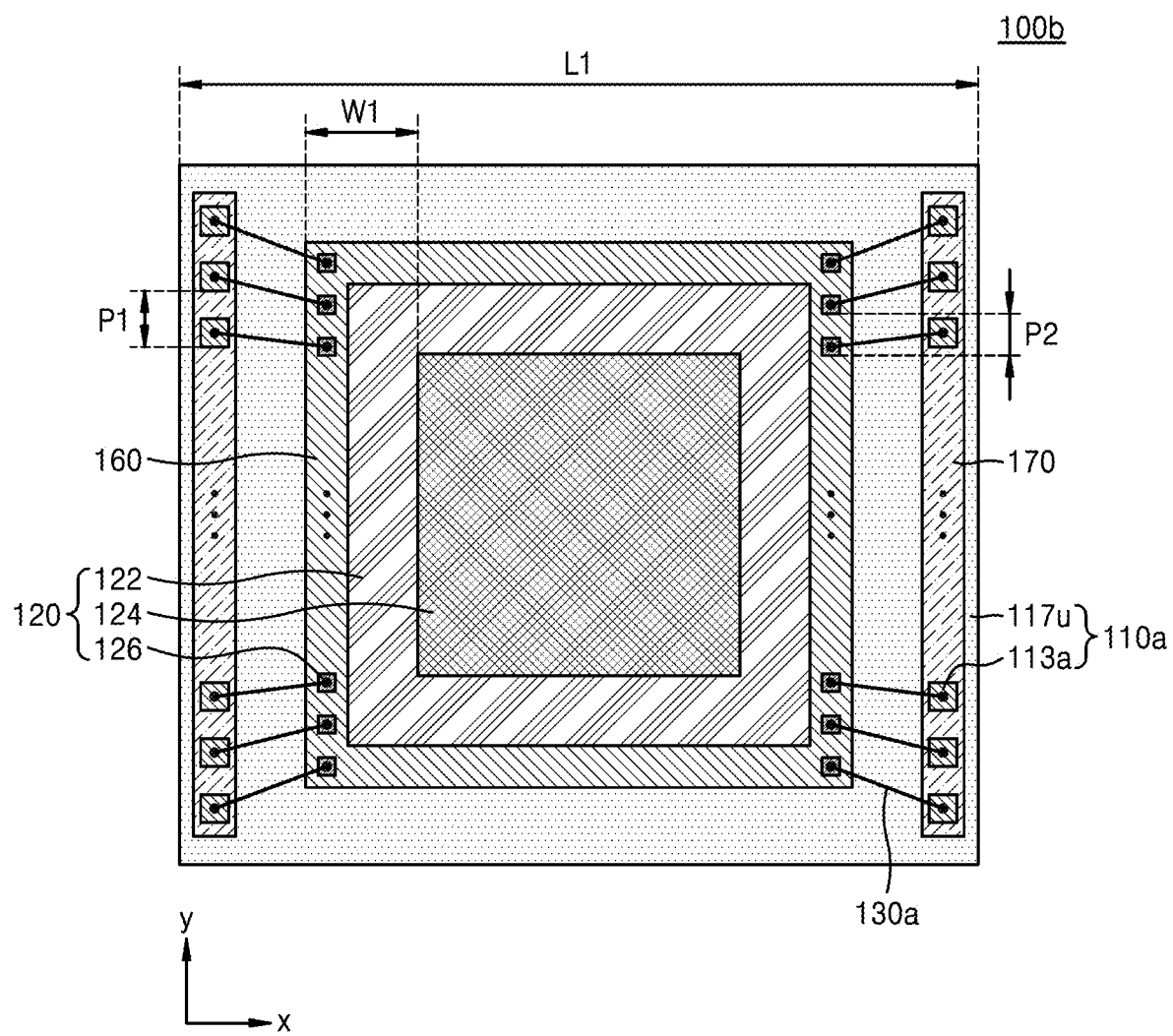
Figure 3C:
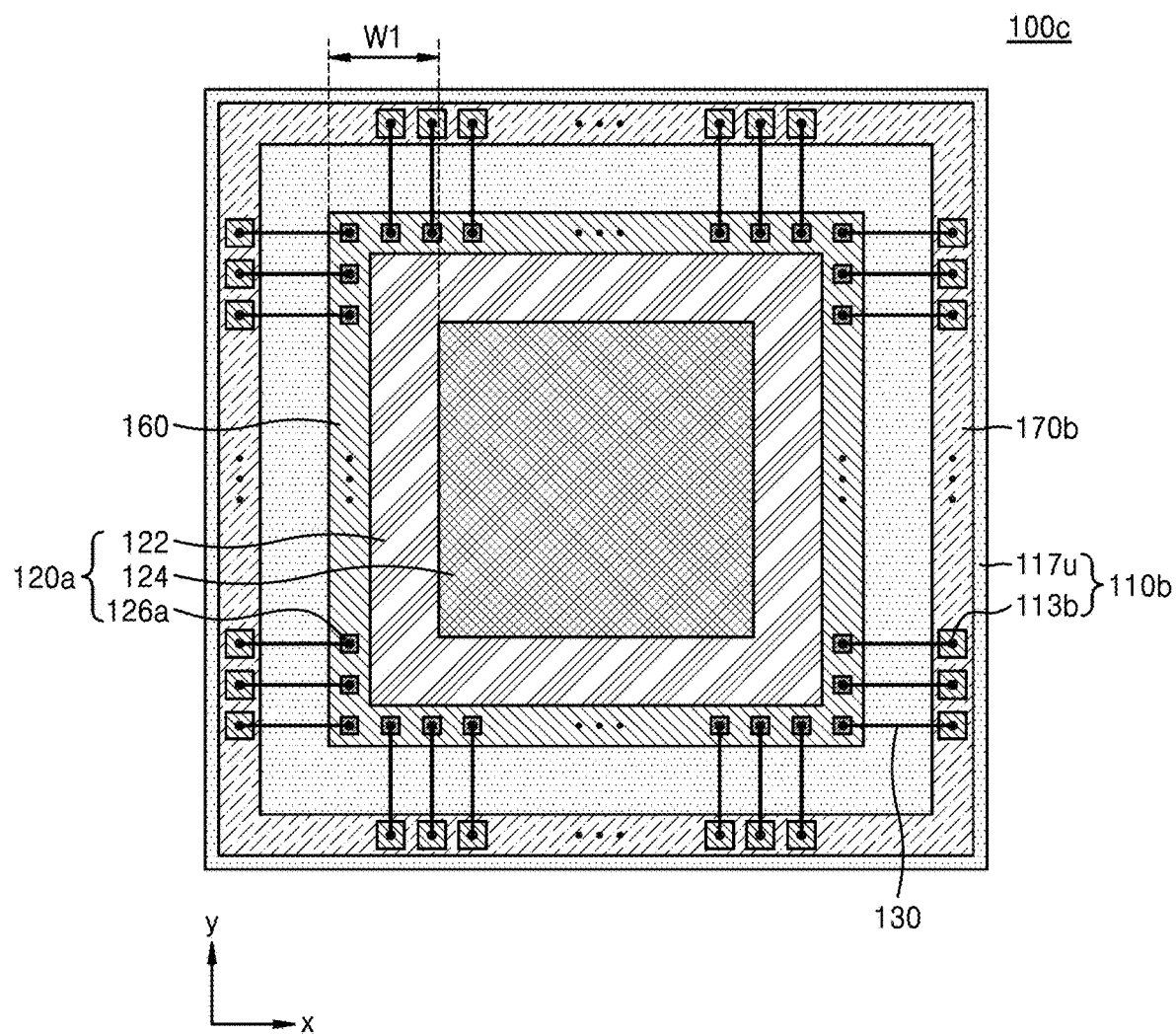

FIGS. 3A to 3C are plan views of image sensor packages 100a, 100b, and 100c according to some example embodiments. The description of components of some example embodiments that are the same as those described with reference to FIGS. 1A to 2B will be omitted or briefly presented.

Referring to FIG. 3A, the image sensor package 100a of some example embodiments may be different from the image sensor package 100 of FIG. 1B in terms of a structure of a stress reducing layer 170a. Specifically, in the image sensor package 100a of some example embodiments, the stress reducing layer 170a may extend in a second direction (y direction) and may cover some upper substrate pads 113 and second ends (refer to 130t2 in FIG. 2A) of some bonding wires 130 corresponding thereto. For example, the stress reducing layer 170a may not cover all upper substrate pads 113, which are arranged in the second direction (y direction), and the second ends 130t2 of all bonding wires 130 corresponding thereto. Accordingly, a plurality of stress reducing layers 170a may be arranged to correspond to all upper substrate pads 113 arranged on either side in a first direction (x direction).

For example, each of the stress reducing layers 170a may cover two upper substrate pads 113, which are adjacent to each other in the second direction (y direction), and second ends 130t2 of two bonding wires 130 corresponding thereto. However, example embodiments are not limited thereto and each of the stress reducing layers 170a may cover at least three upper substrate pads 113 and the second ends 130t2 of at least three bonding wires 130 corresponding thereto. Furthermore, in some example embodiments, the stress reducing layer 170a may cover one upper substrate pad 113 and the second end 130t2 of one bonding wire 130 corresponding thereto.

Referring to FIG. 3B, the image sensor package 100b of some example embodiments may be different from the image sensor package 100 of FIG. 1B in terms of the arrangement of upper substrate pads 113a of a package substrate 110a and a wire bonding structure caused thereby. Specifically, in the image sensor package 100b of some example embodiments, the upper substrate pads 113a may be arranged at a greater pitch, e.g. a greater repeating edge-to-edge distance, than chip pads 126 of an image sensor chip 120. For example, the upper substrate pads 113a may be arranged at a first pitch P1 in a second direction (y direction), and the chip pads 126 may be arranged at a second pitch P2, which is less than the first pitch P1, in the second direction (y direction). For reference, in the image sensor package 100 of FIG. 1B, the upper substrate pads 113 may be arranged at substantially the same pitch as the chip pads 126 in the second direction (y direction).

Because the first pitch P1 between the upper substrate pads 113a is greater than the second pitch P2 between the chip pads 126, in the wire bonding structure bonding wires 130a may have a greater length toward both outer portions of the package substrate 110a in the second direction (y direction) and may spread out, such as in a fan rib shape. Moreover, as shown in FIG. 3B, the stress reducing layers 170 may cover all upper substrate pads 113a, which are arranged in the second direction (y direction), and the second ends 130t2 of all bonding wires 130a corresponding thereto.

However, in some example embodiments, as in the image sensor package 100a of FIG. 3A, the stress reducing layer 170 may cover some upper substrate pads 113a and the second ends 130t2 of some bonding wires 130a corresponding thereto. Also, a plurality of stress reducing layers 170 may be arranged to correspond to all upper substrate pads 113 on either side in a first direction (x direction).

Referring to FIG. 3C, the image sensor package 100c of some example embodiments may be different from the image sensor package 100 of FIG. 1B in that a package substrate 110b and an image sensor chip 120a have square shapes. Also, the image sensor package 100c of some example embodiments may be different from the image sensor package 100 of FIG. 1B in that upper substrate pads 113b of the package substrate 110b and chip pads 126a of the image sensor chip 120a are arranged on all four sides of the package substrate 110b and a wire bonding structure is formed on each of the four sides of the package substrate 110b.

Specifically, in the image sensor package 100c of some example embodiments, the package substrate 110b may have a square shape in a plan view, e.g. in a view from above. Also, the upper substrate pads 113b may be arranged on at least three, such as all four sides of an outer portion of an upper surface of the package substrate 110*b*. For example, the upper substrate pads 113*b* may be arranged in a second direction (y direction) on both sides of the package substrate 110*b* in a first direction (x direction) and also, arranged in the first direction (x direction) on both sides of the package substrate 110*b* in the second direction (y direction). The image sensor chip 120*a* may also have a square shape in a plan view, and the chip pads 126*a* may be arranged on all four sides of an outer portion of an upper surface of the image sensor chip 120*a*. In some example embodiments, at least one of the package substrate 110*b* and the image sensor chip 120*a* may have a long rectangular shape in one direction, for example, the first direction (x direction).

A wire bonding structure may be configured such that the upper substrate pad 113*b* of the package substrate 110*b* is connected to a corresponding one of the chip pads 126*a* of the image sensor chip 120*a* through the bonding wire 130. In addition, the wire bonding structure may be formed on each of all four sides of the package substrate 110*b* or the image sensor chip 120*a* to correspond to the arrangement of the upper substrate pads 113*b* and the chip pads 126*a*.

Moreover, in the image sensor package 100*c* of some example embodiments, the upper substrate pads 113*b* may be arranged at substantially the same pitch as the chip pads 126*a*. Thus, as shown in FIG. 3C, the bonding wires 130 may extend parallel to each other in the first direction (x direction) or in the second direction (y direction). However, in some example embodiments, a pitch between the upper substrate pads 113*b* may be greater than a pitch between the chip pads 126*a*. In this case, as in the image sensor package 100*b* of FIG. 3B, a wire bonding structure may be configured such that the bonding wires 130 spread in a fan rib shape.

As shown in FIG. 3C, the stress reducing layer 170*b* may have a rectangular ring shape surrounding the entire outer portion of the upper surface of the package substrate 110*b*. For example, the stress reducing layer 170*b* may have the rectangular ring shape and cover all the upper substrate pads 113*b* on the upper surface of the package substrate 110*b* and second ends 130*t*2 of all the bonding wires 130 corresponding thereto. However, in some example embodiments, the stress reducing layer 170*b* may only cover some upper substrate pads 113*b* and the second ends 130*t*2 of some bonding wires 130 corresponding thereto. In this case, a plurality of stress reducing layers 170*b* may be arranged. For example, four stress reducing layers 170*b* may be arranged to correspond to four sides of the package substrate 110*b*. In this case, each of the stress reducing layers 170*b* may cover all upper substrate pads 113*b* arranged in a side corresponding thereto and the second ends 130*t*2 of all bonding wires 130 corresponding thereto. Furthermore, in some example embodiments, two, three, or five or more stress reducing layers 170*b* may be arranged on the upper surface of the package substrate 110*b*.

FIGS. 4A to 4D are cross-sectional views of image sensor packages 100*d*, 100*e*, 100*f*, and 100*g* according to some example embodiments. The description of components of some example embodiments that are the same as those described with reference to FIGS. 1A to 3C will be omitted or briefly presented.

Figure 4A:
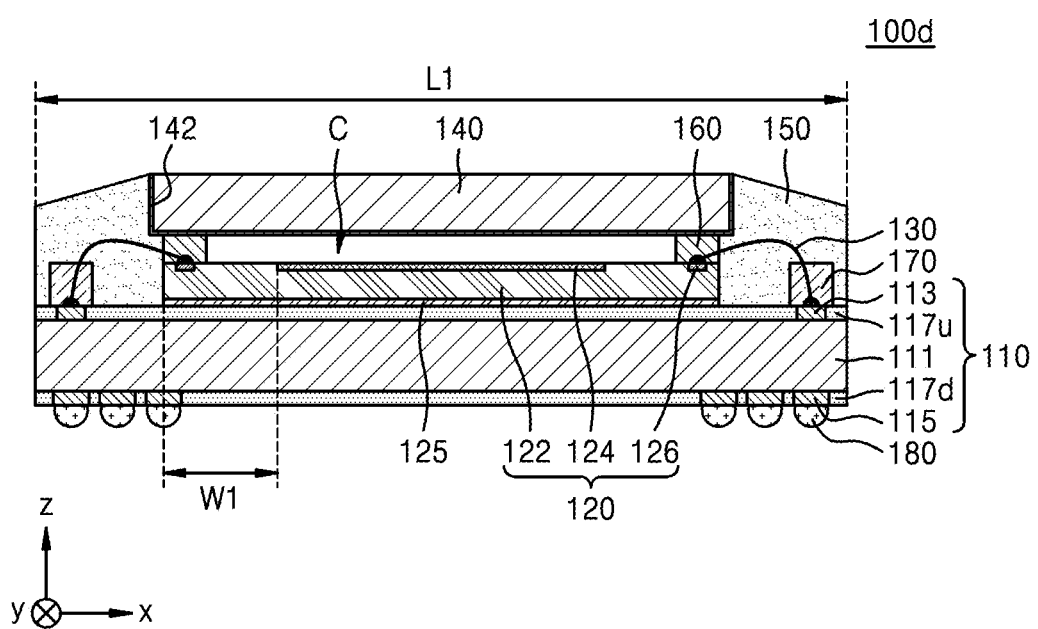
FIGS. 4A to 4D are cross-sectional views of image sensor packages according to embodiments.
Figure 4B:
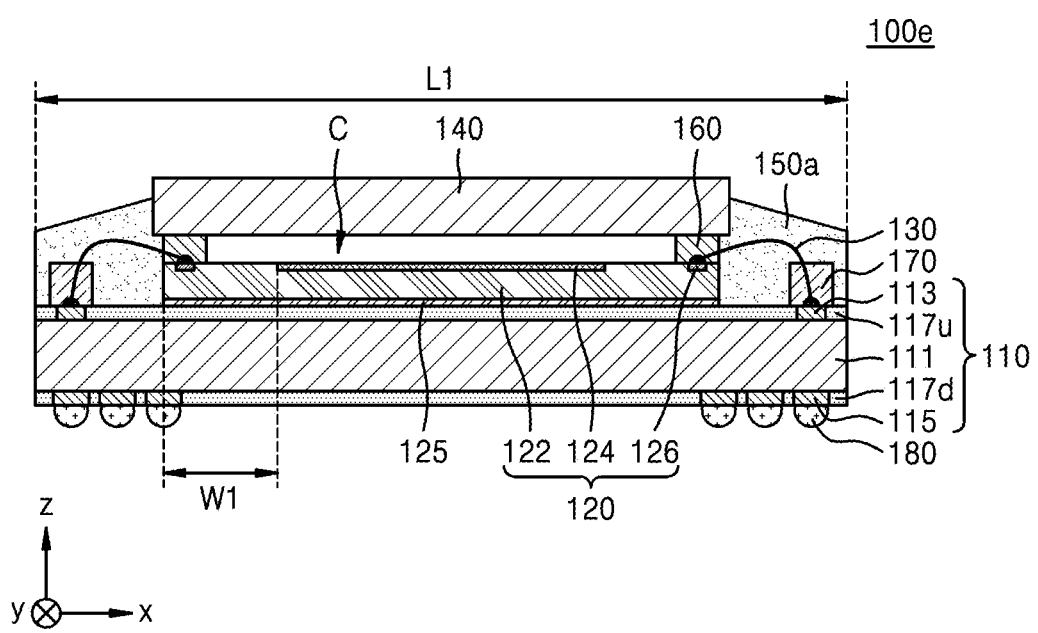

Referring to FIG. 4A, the image sensor package 100*d* of some example embodiments may be different from the image sensor package 100 of FIG. 1A in that the image sensor package 100*d* further includes a coating layer 142 formed on a transparent cover 140. Specifically, in the image sensor package 100*d* of some example embodiments, the coating layer 142 may be formed conformally, and/or may be formed on a lower surface and on a side surface of the transparent cover 140. The coating layer 142 may have various functions. For example, the coating layer 142 may block infrared (IR) light. When the coating layer 142 blocks IR light, an IR filter configured to block IR light may be omitted from a camera device, which may reduce costs. Alternatively or additionally, the coating layer 142 may increase transmittance and/or prevent or reduce the likelihood of reflection. For example, the coating layer 142 may be or may include a blue filter coating layer and/or an anti-reflection coating layer. However, the function of the coating layer 142 is not limited to the above-described functions Referring to FIG. 4B, the image sensor package 100*e* of some example embodiments may be different from the image sensor package 100 of FIG. 1A in terms of a structure of an encapsulant 150*a*. For example, in the image sensor package 100*e* of some example embodiments, the encapsulant 150*a* may cover only a portion of a side surface of a transparent cover 140. For example, the encapsulant 150*a* may cover only a lower portion of the side surface of the transparent cover 140 but expose an upper portion of the side surface of the transparent cover 140. In general, in a process of covering the entire side surface of the transparent cover 140 by the encapsulant 150*a*, the encapsulant 150*a* may cover an upper surface of the transparent cover 140. For example, an overflow defect may occur. Accordingly, only a portion of the side surface of the transparent cover 140 may be covered by the encapsulant 150*a*, and thus, the overflow defect may be prevented or reduced in likelihood of occurrence in advance.

Figure 4C:
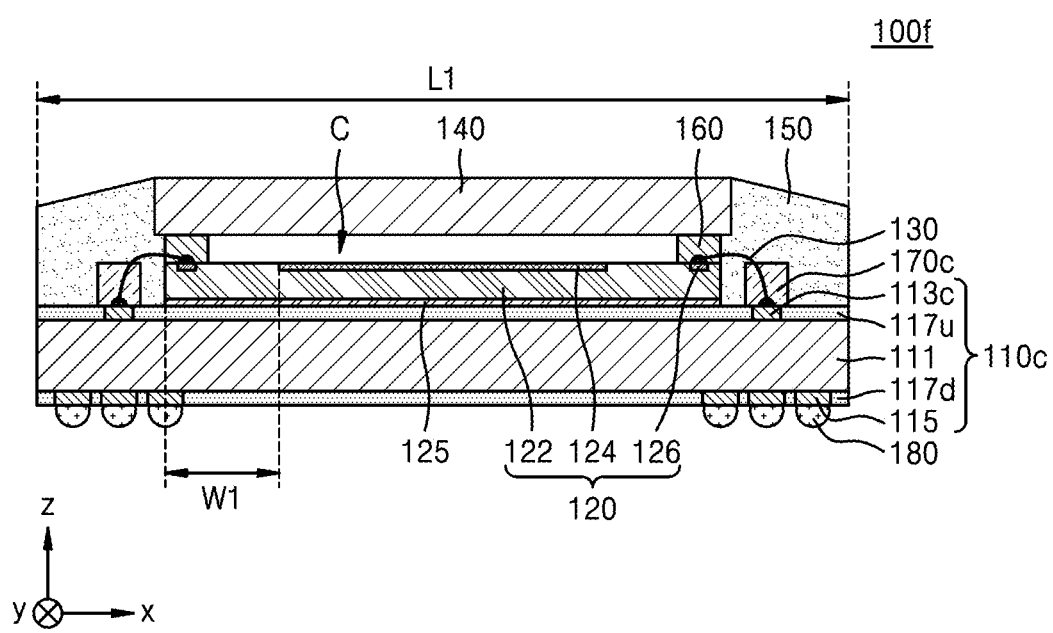

Referring to FIG. 4C, the image sensor package 100*f* of some example embodiments may be different from the image sensor package 100 of FIG. 1A in terms of the arrangement of upper substrate pads 113*c* and a wire bonding structure caused thereby. For example, in the image sensor package 100*f* of some example embodiments, the upper substrate pad 113*c* may be most adjacent to an image sensor chip 120 within a range in which a wire bonding process may be performed. As described above with reference to FIGS. 2A and 2B, stress applied to a bonding wire 130 may be reduced as a length of the bonding wire 130 is reduced. Accordingly, in the image sensor package 100*f* of some example embodiments, the upper substrate pad 113*c* of a package substrate 110*c* may be as close as possible to the image sensor chip 120. Thus, a length of the bonding wire 130 may be reduced, thereby reducing stress applied to the bonding wire 130.

In the image sensor package 100*f* of some example embodiments, a stress reducing layer 170*c* may cover the upper substrate pad 113*c* and a second end 130*t*2 of the bonding wire 130, which is connected to the upper substrate pad 113*c*. In addition, when the upper substrate pads 113*c* are moved to an inner portion of the package substrate 110, the stress reducing layer 170*c* may also be moved to an inner portion of the package substrate 110.

Figure 4D:
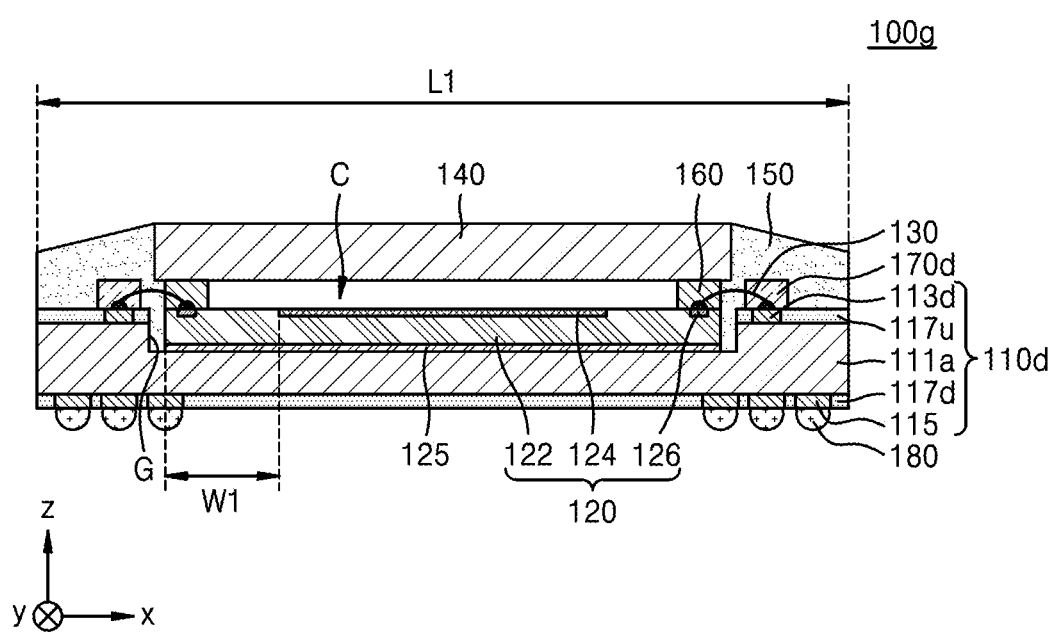

Referring to FIG. 4D, the image sensor package 100*g* of some example embodiments may be different from the image sensor package 100 of FIG. 1A in terms of a structure of a package substrate 110*d* and a mounting structure and a wire bonding structure of an image sensor chip 120, which are caused by the structure of the package substrate 110*d*. For example, in the image sensor package 100*g* of some example embodiments, the package substrate 110*d* may include a groove G formed in a central portion thereof. Also, the image sensor chip 120 may be inside the groove G and adhered to and mounted on the package substrate 110d by using an adhesive layer 125.

Upper substrate pads 113d may be arranged in a second direction (e.g. in a y direction) in outer portions of both side surfaces of the package substrate 110d in a first direction (x direction). However, because the image sensor chip 120 is inside the groove G of the package substrate 110d, a top level of the image sensor chip 120 may be similar to a top level of the package substrate 110d. Also, the upper substrate pad 113d of the package substrate 110d may be maintained at substantially the same level as a chip pad 126 of the image sensor chip 120. Accordingly, when the upper substrate pad 113d is maintained at substantially the same level as the chip pad 126, the upper substrate pad 113d may be as close as possible to the image sensor chip 120. Thus, a length of the bonding wire 130 may be reduced, thereby reducing stress of the bonding wire 130.

In the image sensor package 100g of some example embodiments, the stress reducing layer 170d may cover the upper substrate pad 113d and the second end 130t2 of the bonding wire 130, which is connected to the upper substrate pad 113d. Because the upper substrate pad 113d is maintained at substantially the same level as the chip pad 126, when the stress reducing layer 170d is formed to the same thickness as a dam 160, the stress reducing layer 170d may be at substantially the same top level as the dam 160. Alternatively or additionally, because the image sensor chip 120 is inside the groove G of the package substrate 110d, a top level of the transparent cover 140 stacked on the image sensor chip 120 by using the dam 160 may be lowered by as much as a depth of the groove G, and a thickness of the encapsulant 150 may also be reduced. Accordingly, a total thickness of the image sensor package 100g may be reduced. As a result, the image sensor package 100g of some example embodiments may contribute to implementing an image sensor package having a small thickness.

Example embodiments are not limited to those described above. Furthermore, none of the above described example embodiments are necessarily mutually exclusive to one another. For example, some example embodiments may include some features described with reference to one figure, and may simultaneously include some other features described with reference to one or more other figures.

Figure 5:
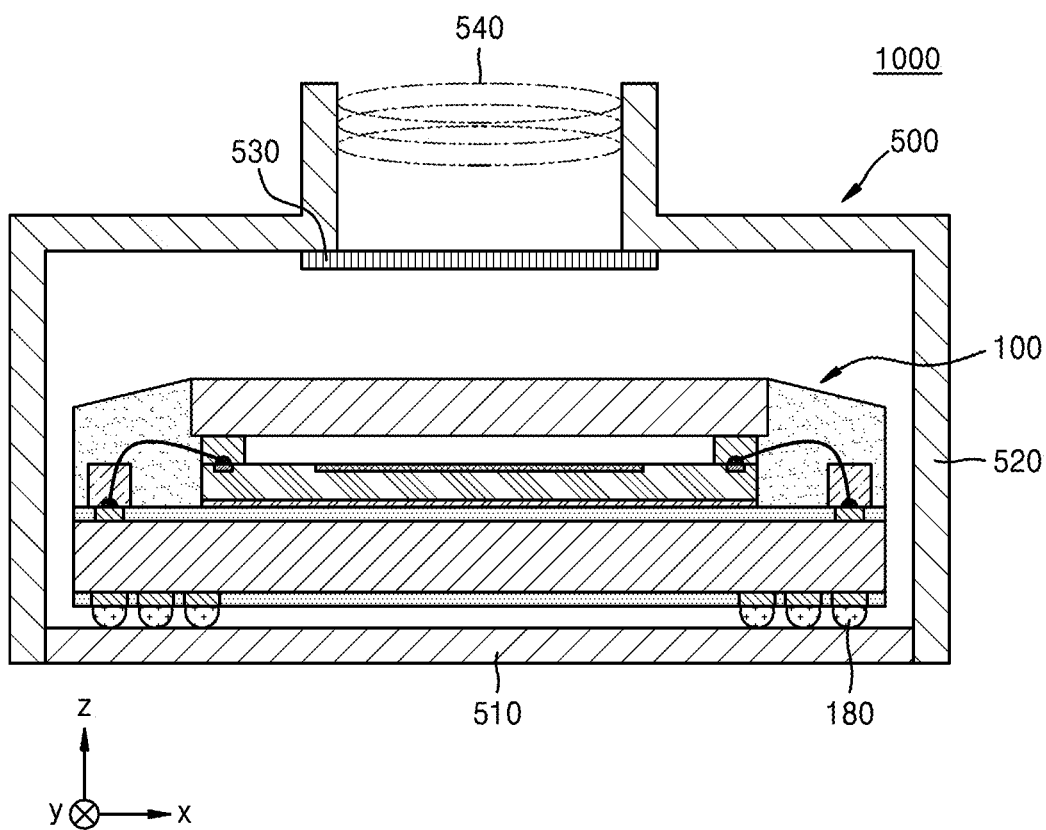
FIG. 5 is a cross-sectional view of a camera device including an image sensor package, according to some example embodiments.

FIG. 5 is a cross-sectional view of a camera device 1000 including an image sensor package 100, according to some example embodiments. The description of components of some example embodiments that are the same as those described with reference to FIGS. 1A to 4D will be omitted or briefly presented.

Referring to FIG. 5, the camera device 1000 of some example embodiments may include the image sensor package 100 and a camera appearance form factor or chassis, or camera appearance unit 500. In the camera device 1000 of some example embodiments, the image sensor package 100 may include the image sensor package 100 of FIG. 1A. However, inventive concepts are not limited thereto, and the camera device 1000 of some example embodiments may adopt one or more of the image sensor packages 100a to 100g shown in FIGS. 3A to 3C and FIG. 4A to 4D instead of or in addition to the image sensor package 100 of FIG. 1A.

The camera appearance unit 500 may include an external substrate 510, a housing 520, a filter 530, and a lens 540. The image sensor package 100 may be mounted on the external substrate 510 by using an external connection terminal 180. The external connection terminal 180 may be or may include, for example, a solder ball. The image sensor package 100 may be electrically connected to the external substrate 510 through the external connection terminal 180. The external substrate 510 may include a circuit configured to perform an additional function or a circuit to be connected to another device. When there is no need to form a substrate separately, the external substrate 510 may constitute a portion of the housing 520.

The housing 520 may surround the image sensor package 100 and may protect the image sensor package 100 from external physical impact. Additionally or alternatively, the housing 520 may include an electromagnetic interference (EMI) shielding material and may shield the image sensor package 100 from disturbance.

The filter 530 may be positioned at an entrance side of the housing 520 in which the lens 540 is located, and be a predetermined distance apart from the image sensor package 100. The filter 530 may include, for example, an infrared (IR) cut-off filter, namely, an IR filter. In some example embodiments, the filter 530 may be provided as a separate component from the camera appearance unit 500. Alternatively, when a coating layer 142 configured to block IR light is formed on a transparent cover 140 as described above, the filter 530 may be omitted.

The lens 540 may be at an entrance portion (e.g., a barrel portion) of the housing 520 and refract external incident light and emit the refracted light to the image sensor package 100. For example, the external incident light may be condensed on the sensor unit 124 of the image sensor chip 120 of the image sensor package 100 through the lens 540. As shown in FIG. 5, a plurality of lenses 540 may be at the barrel portion of the housing 520.

The camera device 1000 of some example embodiments may be used in various fields. For example, the camera device 1000 may be applied to front and rear cameras for vehicles. Compulsory installation of image sensor packages for vehicles is underway worldwide, and may be starting with rear cameras. The image sensor packages for the vehicles have been transitioning away from the role of parking assistance and linked to driving systems, and more weight is being placed on the image sensor packages for autonomous vehicles. Accordingly, the reliability of the image sensor packages for vehicles is emerging as a more important issue than before.

As described above, the image sensor package 100 of the camera device 1000 of some example embodiments may include a stress reducing layer 170 including the same material as a dam 160, and an encapsulant 150 and the dam 160 may have physical properties in the same ranges as those described above. As a result, stress applied to a bonding wire 130 may be reduced, and thus, defects (e.g., cracks) may be prevented or reduced in likelihood from occurring in the bonding wire 130 to greatly improve reliability. Accordingly, the camera device 1000 of some example embodiments may include the image sensor package 100 having high reliability and be useful for vehicle cameras.

FIGS. 6A to 6I are cross-sectional views of a method of fabricating an image sensor, according to some example embodiments. FIGS. 6A to 6I will be described with reference to FIGS. 1A and 1B. The description of components of some example embodiments that are the same as those described with reference to FIGS. 1A to 5 will be omitted or briefly presented.

Figure 6A:
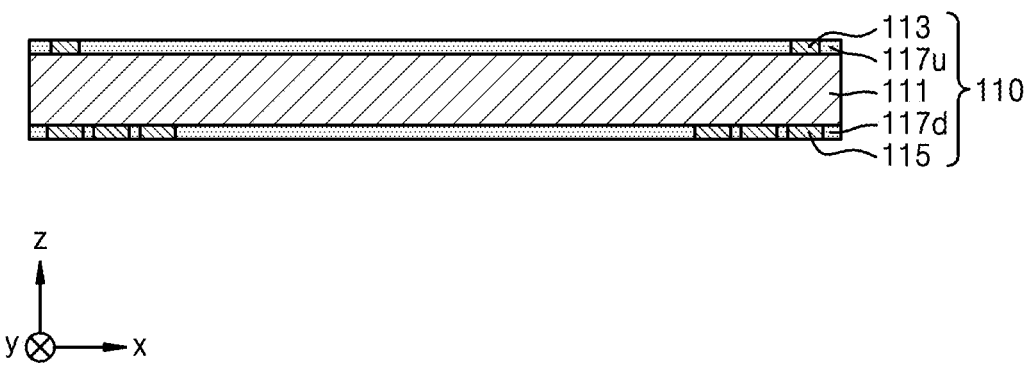
FIGS. 6A to 6I are cross-sectional views of a method of fabricating an image sensor, according to some example embodiments.

Referring to FIG. 6A, to begin with, the method of manufacturing/fabricating the image sensor package according to some example embodiments may include preparing a package substrate 110. The package substrate 110 may include a body layer 111, an upper substrate pad 113, a lower substrate pad 115, and upper and lower protective layers 117u and 117d. The body layer 111 may include single-layered or multilayered wirings, and the upper substrate pad 113 may be electrically connected to the lower substrate pad 115 corresponding thereto through the wirings of the body layer 111. Moreover, the package substrate 110 shown in FIG. 6A may be a portion of a prototype substrate including a plurality of package substrates 110.

The upper substrate pads 113 may be on an upper surface of the package substrate 110 and arranged in a second direction (y direction) in outer portions of both side surfaces of the package substrate 110 in a first direction (x direction). The lower substrate pads 115 may be formed on a lower surface of the body layer 111 and arranged in three columns. However, in some example embodiments, the lower substrate pads 115 may be arranged in two or four or more columns or arranged in a 2D array structure over the entire lower surface of the body layer 111. The upper substrate pads 113 and the lower substrate pads 115 may pass through the upper and lower protective layers 117u and 117d respectively corresponding thereto and be exposed at the upper and lower protective layers 117u and 117d.

Figure 6B:
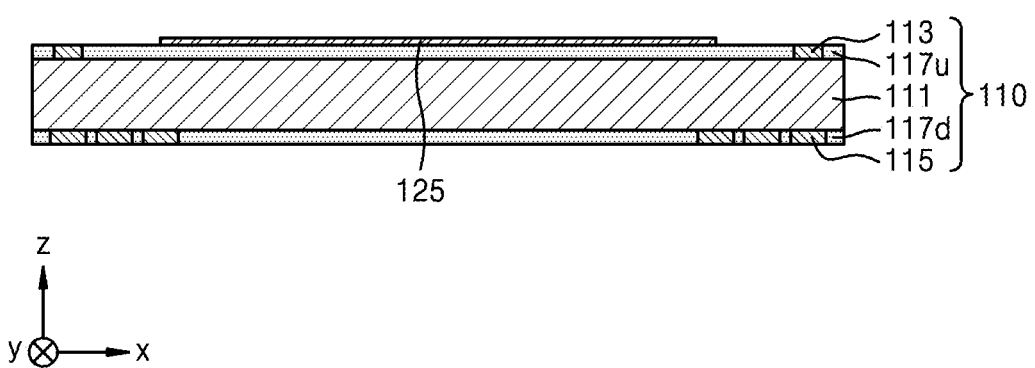

Referring to FIG. 6B, an adhesive layer 125 may be formed by coating the upper surface of the package substrate 110 with an adhesive. The adhesive layer 125 may be formed in a central portion of the upper surface of the package substrate 110 to correspond to a position at which the image sensor chip 120 is to be mounted. Moreover, the formation of the adhesive layer 125 may include coating the upper surface of the package substrate 110 with a flowable adhesive by using a dispenser, and curing the flowable adhesive to some extent, and/or may include adhering an adhesive film to the central portion of the upper surface of the package substrate 110.

Figure 6C:
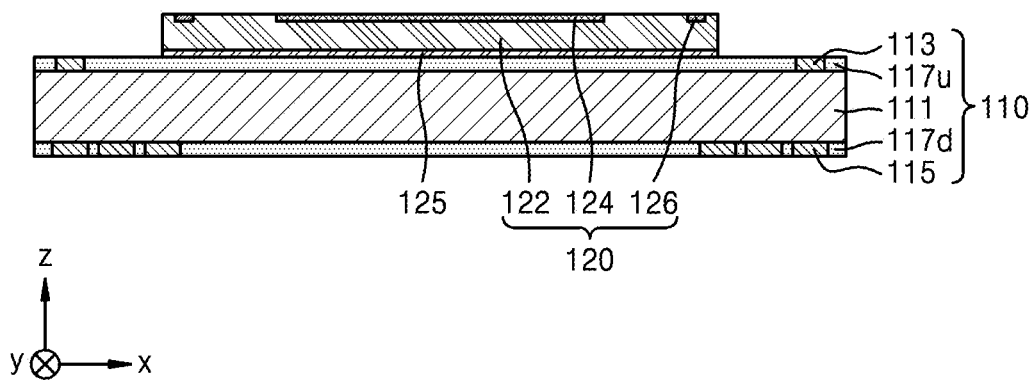

Referring to FIG. 6C, the image sensor chip 120 may be mounted on the package substrate 110. The image sensor chip 120 may be adhered and fixed to the package substrate 110 by the adhesive layer 125. The image sensor chip 120 may include a chip body 122, a sensor unit 124, and a chip pad 126. The chip body 122 may include a substrate and a wiring layer of the image sensor chip 120. The sensor unit 124 may include a pixel area PIa including a plurality of pixels, and the pixels may be arranged in a 2D array structure in the pixel area PIa. Each of the pixels of pixel area PIa may include a photodiode formed in or within the substrate. The sensor unit 124 may be in a central portion of the image sensor chip 120. The chip pad 126 may be in a peripheral area PEa of the image sensor chip 120. The chip pads 126 may be arranged in the second direction (y direction) in outer portions of both peripheral areas of the image sensor chip 120 in the first direction (x direction).

Figure 6D:
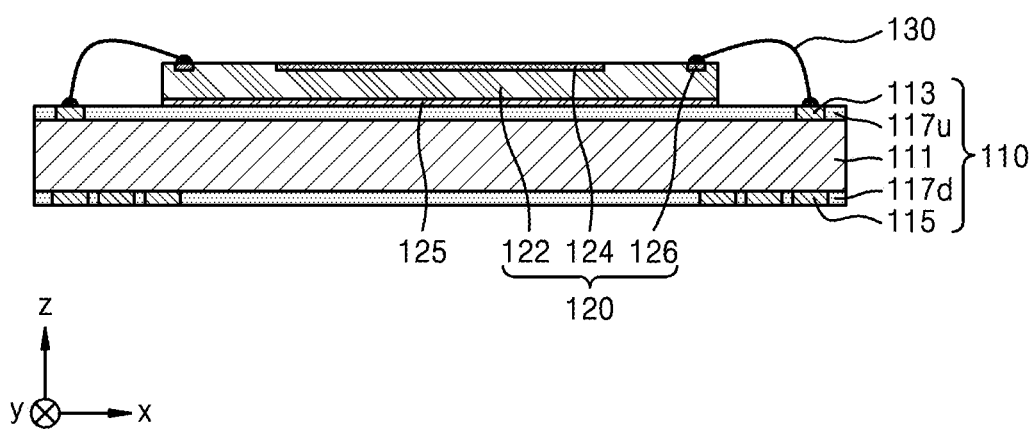

Referring to FIG. 6D, a wire bonding process for connecting the chip pads 126 of the image sensor chip 120 to the upper substrate pads 113 of the package substrate 110, which correspond thereto, by using bonding wires 130 may be performed. The wire bonding process may be performed using, for example, capillary. Due to the wire bonding process, a first end 130t1 of the bonding wire 130 may be connected to the chip pad 126, and a second end 130t2 of the bonding wire 130 may be connected to the upper substrate pad 113. In the method of fabricating the image sensor package according to some example embodiments, the bonding wire 130 may include or consist of, for example, gold. However, a material of the bonding wire 130 is not limited to gold.

Figure 6E:
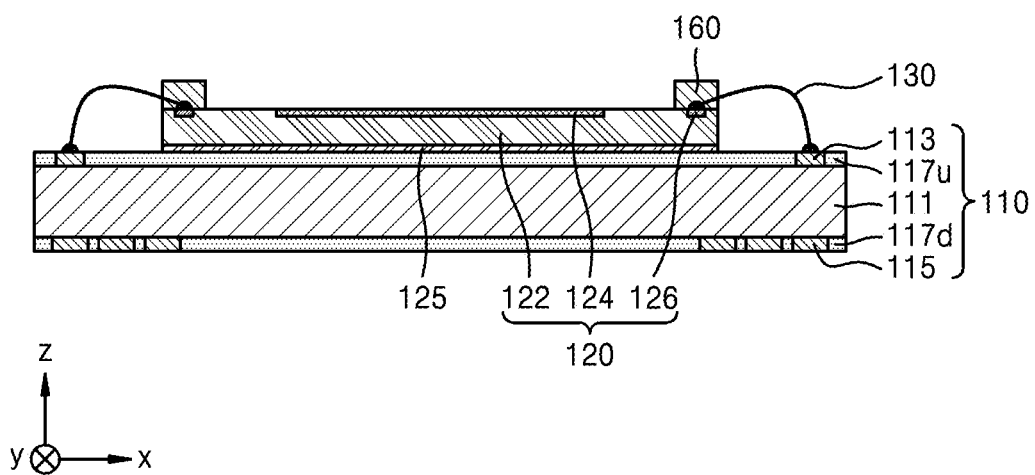

Referring to FIG. 6E, the dam 160 may be formed on an upper surface of the image sensor chip 120. The dam 160 may be formed by a dispensing method using a dispenser. As shown in FIG. 1B, the dam 160 may surround an outer portion of the upper surface of the image sensor chip 120 and have a rectangular ring shape. Moreover, the dam 160 may cover the chip pad 126 of the image sensor chip 120 and the first end 130t1 of the bonding wire 130, which is connected to the chip pad 126. The dam 160 may include a material having the above-described physical properties. For example, the dam 160 may include a material having a viscosity of about 40,000 cps to about 80,000 cps (@25° C.), a glass temperature of about 125° C. to about 160° C., a CTE of about 18 ppm or less at a temperature lower than the glass temperature, and a CTE of about 70 ppm or less at the glass temperature or higher. As a specific example, the dam 160 may include a glue adhesive. The glue adhesive may meet or approximately be within the ranges of physical properties described above, by adjusting components of and/or a content ratio of a filler.

Figure 6F:
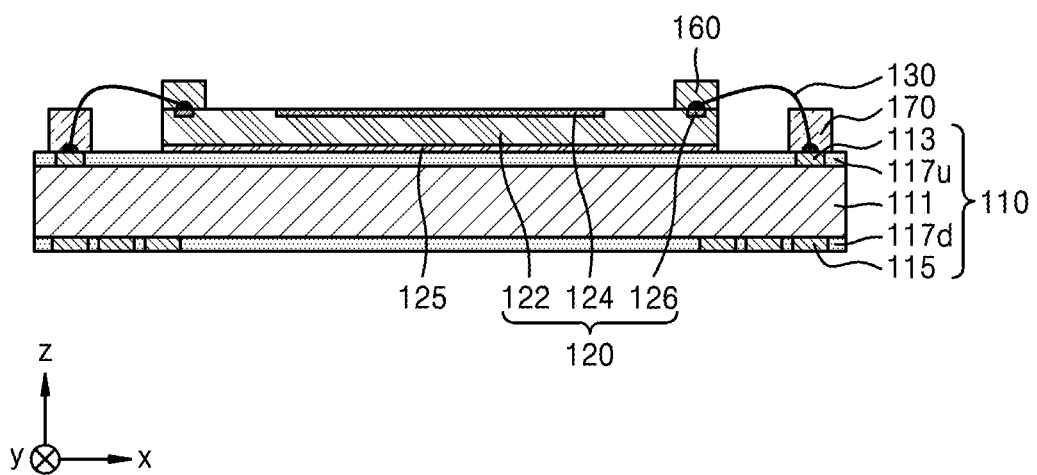

Referring to FIG. 6F, the stress reducing layer 170 may be formed on the package substrate 110. The stress reducing layer 170 may also be formed by a dispensing method using a dispenser. As shown in FIG. 1B, the stress reducing layer 170 may have a straight line shape extending in the second direction (y direction) in the outer portions of both the side surfaces of the package substrate 110 in the first direction (x direction). The stress reducing layer 170 may cover the upper substrate pad 113 of the package substrate 110 and the second end 130t2 of the bonding wire 130, which is connected to the upper substrate pad 113. Alternatively or additionally, the stress reducing layer 170 may include or consist of substantially the same material as the dam 160. As an example, the stress reducing layer 170 may include the glue adhesive. The glue adhesive may meet or approximately be in the ranges of physical properties described above by adjusting components or a content ratio of a filler.

Figure 6G:
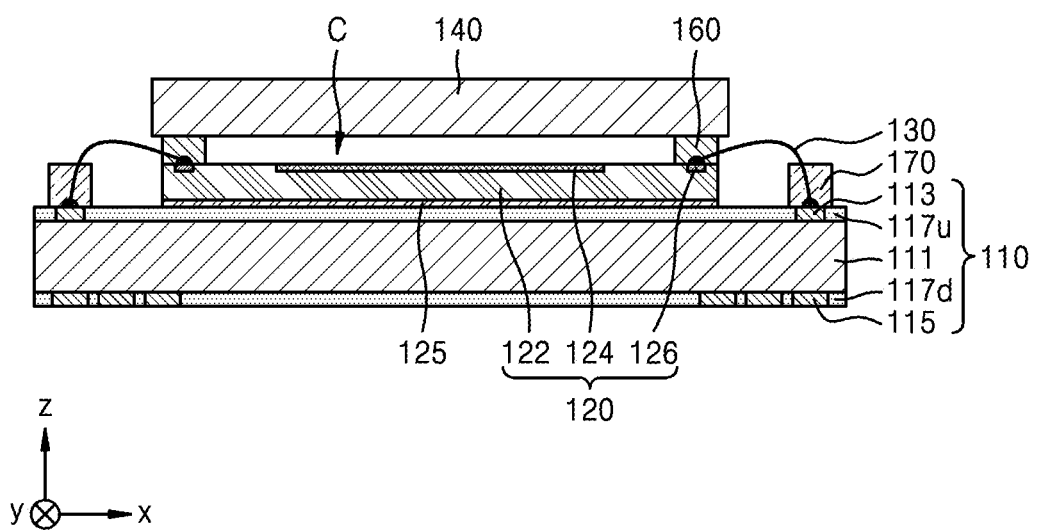

Referring to FIG. 6G, a transparent cover 140 may be stacked on the dam 160. For example, the stacking of the transparent cover 140 on the dam 160 may be performed while heat and pressure are applied. The dam 160 may be adhered to the transparent cover 140 due to viscosity and encapsulate a cavity C. The dam 160 may encapsulate the cavity C and prevent or reduce the likelihood of external moisture or foreign materials from penetrating into the sensor unit 124 of the image sensor chip 120.

Figure 6H:
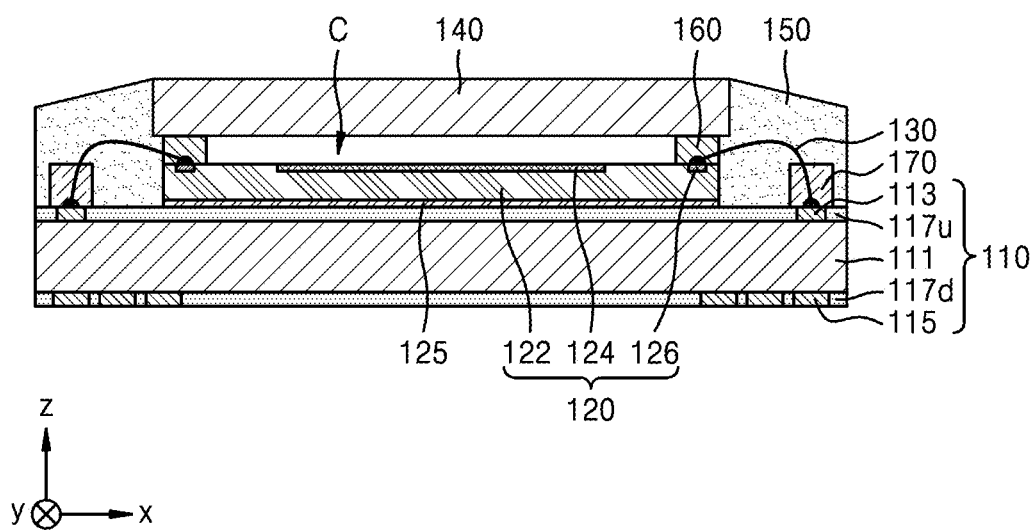

Referring to FIG. 6H, the image sensor chip 120, the bonding wire 130, and the transparent cover 140 may be encapsulated by coating the package substrate 110 with an encapsulant 150. The encapsulant 150 may cover side surfaces of the image sensor chip 120 and the dam 160. Alternatively or additionally, the encapsulant 150 may cover a side surface and a portion of the lower surface of the transparent cover 140. Alternatively or additionally, the encapsulant 150 may cover a middle line 130m of the bonding wire 130 between the first end 130t1 and the second end 130t2. The encapsulant 150 may prevent or reduce the likelihood of the sensor unit 124 of the image sensor chip 120 from being contaminated with foreign materials and protect the image sensor package 100 from external impact.

The encapsulant 150 may include a material having the above-described physical properties. For example, the encapsulant 150 may include a material having a viscosity of about 40,000 cps to about 80,000 cps (@25° C.), a glass temperature of about 125° C. to about 160° C., a CTE of about 18 ppm or less at a temperature lower than the glass temperature, and a CTE of about 70 ppm or less at the glass temperature or higher. As a specific example, the encapsulant 150 may include the second material described above. The second material may meet or approximately be within the ranges of physical properties described above by adjusting components or a content ratio of a filler. Moreover, the encapsulant 150 may be formed by, for example, a dispensing method using a dispenser.

Figure 6I:
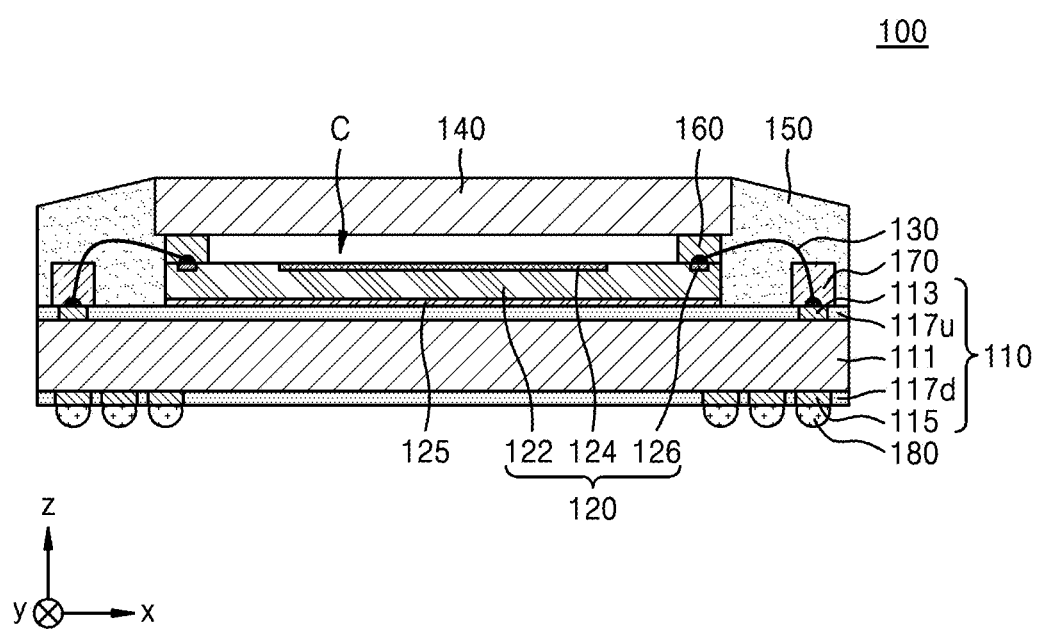

Referring to FIG. 6I, an external connection terminal 180 may be adhered to the lower substrate pad 115 on the lower surface of the package substrate 110. The external connection terminal 180 may include, for example, a solder ball. Moreover, the operations described with reference to FIGS. 6A to 6I may be performed on a prototype substrate including a plurality of package substrates 110. Thus, after the external connection terminal 180 is formed, a singulation process may be performed. After the singulation process, the image sensor package 100 of FIG. 1A may be fabricated.

Figure 7A:
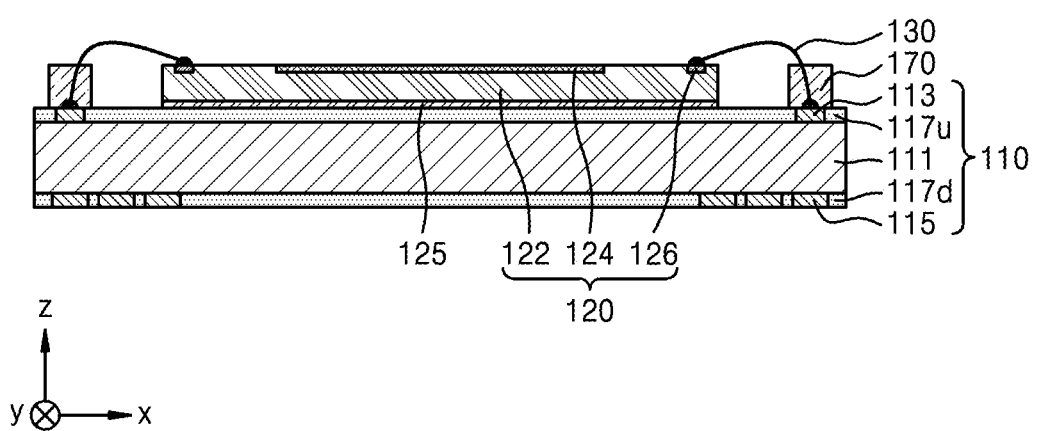
FIGS. 7A and 7B are cross-sectional views of a method of fabricating an image sensor package, according to some example embodiments.
Figure 7B:
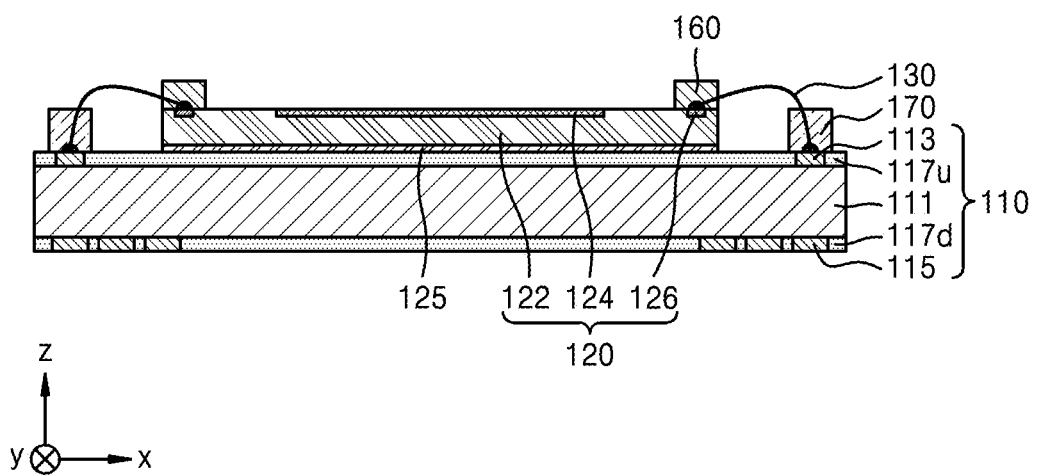

FIGS. 7A and 7B are cross-sectional views of a method of fabricating an image sensor package, according to some example embodiments. FIGS. 7A and 7B will be described with reference to FIGS. 1A and 1B. The description of components of some example embodiments that are the same as those described with reference to FIGS. 6A to 6I will be omitted or briefly presented.

Referring to FIG. 7A, the method of fabricating the image sensor package of some example embodiments may include sequentially performing the operations of FIGS. 6A to 6D. Thereafter, as shown in FIG. 6F, a stress reducing layer 170 may be formed on the package substrate 110. At least one of a shape, a forming method, and a material of the stress reducing layer 170 may be the same as those described with reference to FIG. 6F.

Referring to FIG. 7B, after the stress reducing layer 170 is formed, a dam 160 may be formed on the upper surface of the image sensor chip 120 as shown in FIG. 6E. A shape, a forming method, and a material of the dam 160 may be the same as those described with reference to FIG. 6E. Subsequently, the operations described with reference to FIGS. 6G to 6I and a singulation process may be performed, and thus, the image sensor package 100 of FIG. 1A may be fabricated.

In conclusion, the method of fabricating the image sensor package of some example embodiments may be different from the method of fabricating the image sensor package, which has been described with reference to FIGS. 6A to 6I, in that the stress reducing layer 170 is formed earlier than the dam 160. Moreover, because both the stress reducing layer 170 and the dam 160 are formed by a dispensing method using a dispenser, in some example embodiments, the stress reducing layer 170 and the dam 160 may be simultaneously formed together.

While inventive concepts has been particularly shown and described with reference to some example embodiments thereof, it will be understood that various changes in form and details may be made therein without departing from the spirit and scope of the following claims.

What is claimed is:

1. An image sensor package, comprising:
   a package substrate;
   an image sensor chip mounted on the package substrate;
   a transparent cover on the image sensor chip;
   an encapsulant encapsulating the image sensor chip and covering a side surface of the transparent cover;
   a dam on an upper surface of the image sensor chip and surrounding an outer portion of the upper surface of the image sensor chip, the transparent cover on the dam;
   a bonding wire electrically connecting a chip pad of the image sensor chip to a substrate pad of the package substrate, the dam covering a first end of the bonding wire connected to the chip pad; and
   a stress reducing layer covering a second end of the bonding wire connected to the substrate pad, the stress reducing layer including a same material as the dam,
   wherein the dam comprises a different material than the encapsulant, and
   wherein the encapsulant directly contacts and covers a middle portion of the bonding wire between the first end covered by the dam and the second end covered by the stress reducing layer.

2. The image sensor package of claim 1, wherein the image sensor chip comprises a sensor circuitry in an upper central portion of the image sensor chip, and
   a distance between an edge of the sensor circuitry and an edge of the image sensor chip is 520 μm or less.

3. The image sensor package of claim 1, wherein a glass temperature of each of the dam and the encapsulant is in a range of 125° C. to 160° C.

4. The image sensor package of claim 3, wherein the dam and the encapsulant have a first coefficient of thermal expansion (CTE) of 18 ppm/° C. or less at a temperature lower than the glass temperature of each of the dam and the encapsulant, and have a second CTE of 70 ppm/° C. or less at the glass temperature of each of the dam and the encapsulant or at a temperature greater than the glass temperature of each of the dam and the encapsulant.

5. The image sensor package of claim 1, wherein the bonding wire has a length of 0.7 mm or less,
   the encapsulant has a glass temperature of 148° C. and has a first coefficient of thermal expansion (CTE) of 18 ppm/° C. at a temperature lower than the glass temperature of the encapsulant and a second CTE of 65 ppm/° C. at the glass temperature or at a temperature higher than the glass temperature of the encapsulant, and
   the image sensor package has a length of 8.0 mm or more in a lengthwise direction of the image sensor package.

6. The image sensor package of claim 1, wherein a cavity is between the image sensor chip and the transparent cover, the cavity encapsulated by the dam, and
   the cavity exposes an upper surface of a sensor circuitry of the image sensor chip.

7. The image sensor package of claim 1, wherein the transparent cover has a length greater than a length of the image sensor chip, and
   the dam is in an outermost portion of the image sensor chip, and an outer side surface of the dam is on an inner side of the side surface of the transparent cover.

8. The image sensor package of claim 1, further comprising:
   a plurality of chip pads, including the chip pad, and a plurality of substrate pads, including the substrate pad, wherein the plurality of chip pads and the plurality of substrate pads are along both side surfaces of the image sensor chip, and at least one of
   the stress reducing layer covers second ends, including the second end, of all bonding wires, including the bonding wire, arranged on any side surface of the image sensor chip together, or
   the stress reducing layer covers the second ends of at least some of the bonding wires together.

9. The image sensor package of claim 1, wherein the dam comprises glue, and
   the encapsulant comprises epoxy.

10. The image sensor package of claim 1, further comprising:

an external connection terminal disposed on a lower surface of the package substrate, and the image sensor package is mounted on an external substrate of a camera device, the mounting of the image sensor package through the external connection terminal.

11. An image sensor package, comprising:

a package substrate having an upper surface on which a substrate pad is located and having a lower surface on which an external connection terminal is located;

an image sensor chip on the package substrate, the image sensor chip comprising a sensor circuitry in an upper central portion of the image sensor chip;

a dam on an upper surface of the image sensor chip, the dam surrounding an outer portion of the upper surface of the image sensor chip, the dam covering a chip pad of the image sensor chip;

a transparent cover on the dam and apart from the upper surface of the image sensor chip;

a bonding wire configured to electrically connect the chip pad to the substrate pad;

a stress reducing layer on the package substrate, the stress reducing layer covering the substrate pad; and an encapsulant on the package substrate, the encapsulant encapsulating the image sensor chip and covering a side surface of the transparent cover, wherein a material of the stress reducing layer is the same as a material of the dam, wherein the dam covers a first end of the bonding wire which is connected to the chip pad, the stress reducing layer covers a second end of the bonding wire which is connected to the substrate pad, and the encapsulant covers a middle portion of the bonding wire between the first end and the second end, wherein the dam comprises a different material than the encapsulant, and wherein the encapsulant directly contacts and covers a middle portion of the bonding wire between the first end covered by the dam and the second end covered by the stress reducing layer.

12. The image sensor package of claim 11, wherein a distance between an edge of the sensor circuitry and an edge of the image sensor chip is 520 μm or less.

13. The image sensor package of claim 11, wherein a glass temperature of each of the dam and the encapsulant is in a range of 125° C. to 160° C., and the dam and the encapsulant have a first coefficient of thermal expansion (CTE) of 18 ppm/° C. or less at a temperature lower than the glass temperature of each of the dam and the encapsulant, and have a second CTE of 70 ppm/° C. or less at the glass temperature of each of the dam and the encapsulant or at a temperature greater than the glass temperature of each of the dam and the encapsulant.

14. The image sensor package of claim 11, wherein the stress reducing layer covers second ends, including the second end, of all bonding wires, including the bonding wire, arranged on any side surface of the image sensor chip together or the stress reducing layer covers the second ends of at least some of the bonding wires together.

15. The image sensor package of claim 11, wherein the dam and the stress reducing layer comprise glue, and the encapsulant comprises an epoxy.

* * * * *